(12) United States Patent
Nagai et al.

(10) Patent No.: US 10,268,119 B2
(45) Date of Patent: Apr. 23, 2019

(54) EXTREME ULTRAVIOLET LIGHT GENERATING DEVICE

(71) Applicant: GIGAPHOTON INC., Tochigi (JP)

(72) Inventors: Shinji Nagai, Oyama (JP); Atsushi Ueda, Oyama (JP); Takashi Saito, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/945,672

(22) Filed: Apr. 4, 2018

(65) Prior Publication Data

US 2018/0224748 A1    Aug. 9, 2018

Related U.S. Application Data

(63) Continuation of application No. PCT/JP2015/081316, filed on Nov. 6, 2015.

(51) Int. Cl.
*G03F 7/20* (2006.01)
*G21K 5/02* (2006.01)
(Continued)

(52) U.S. Cl.
CPC ........... *G03F 7/70033* (2013.01); *G21K 1/06* (2013.01); *G21K 5/02* (2013.01); *H01J 37/3244* (2013.01); *H05G 1/00* (2013.01); *H05G 2/008* (2013.01)

(58) Field of Classification Search
USPC ....................................... 250/504 R; 378/119
See application file for complete search history.

(56) References Cited

U.S. PATENT DOCUMENTS 8,945,310 B2 * 2/2015 Zink ..................... B08B 7/00
                                                         134/1
2007/0228298 A1   10/2007 Komori et al.
(Continued)

FOREIGN PATENT DOCUMENTS

JP    2007-273239 A    10/2007
JP    2009-021566 A    1/2009
(Continued)

OTHER PUBLICATIONS

International Search Report issued in corresponding International Application No. PCT/JP2015/081316; dated Feb. 9, 2016.
(Continued)

*Primary Examiner* — Kiet T Nguyen
(74) *Attorney, Agent, or Firm* — Studebaker & Brackett PC

(57) ABSTRACT

An extreme ultraviolet light generating device may include a chamber, an EUV light focusing mirror provided therein, including a reflection surface having a concave curved shape and an outer peripheral portion around an outer edge of the reflection surface, and configured to focus EUV light radiated from plasma generated when a target is irradiated with laser light, a gas supplying device including peripheral heads provided on or along the outer peripheral portion; and a discharge device including a discharge path forming a discharge port near the outer peripheral portion, and configured to discharge an ion or a particle from the discharge port. The peripheral heads each may blow out a gas flow from the outer peripheral portion or a vicinity thereof along the reflection surface, and allow gas flows to join on the reflection surface to thereby form a gas flow along the reflection surface toward the discharge port.

10 Claims, 25 Drawing Sheets

(51) Int. Cl.
*H05G 1/00* (2006.01)
*G21K 1/06* (2006.01)
*H01J 37/32* (2006.01)
*H05G 2/00* (2006.01)

(56) References Cited

U.S. PATENT DOCUMENTS

| | | |
|---|---|---|
| 2009/0014027 A1 | 1/2009 | Schriever |
| 2009/0250639 A1 | 10/2009 | Banine et al. |
| 2010/0140514 A1 | 6/2010 | Bykanov et al. |
| 2011/0128519 A1 | 6/2011 | Soer et al. |
| 2011/0188014 A1 | 8/2011 | Banine et al. |
| 2012/0119116 A1 | 5/2012 | Kakizaki et al. |
| 2012/0223257 A1 | 9/2012 | Nagai et al. |
| 2013/0088697 A1 | 4/2013 | Labetski et al. |
| 2015/0156855 A1 | 6/2015 | Ershov et al. |

FOREIGN PATENT DOCUMENTS

| | | |
|---|---|---|
| JP | 2010-537424 A | 12/2010 |
| JP | 2010-538420 A | 12/2010 |
| JP | 2011-023712 A | 2/2011 |
| JP | 2011-029639 A | 2/2011 |
| JP | 2011-530819 A | 12/2011 |
| JP | 2013-004369 A | 1/2013 |
| JP | 2013-526026 A | 6/2013 |
| WO | 2015/082997 A1 | 6/2015 |

OTHER PUBLICATIONS

International Preliminary Report on Patentability issued in corresponding International Application No. PCT/JP2015/081316; dated May 8, 2018.

* cited by examiner

EXTREME ULTRAVIOLET LIGHT GENERATING DEVICE

CROSS-REFERENCE TO RELATED APPLICATIONS

The present application is a continuation application of International Application No. PCT/JP2015/081316 filed on Nov. 6, 2015. The content of the application is incorporated herein by reference in its entirety.

BACKGROUND

1. Technical Field

The present disclosure relates to an extreme ultraviolet light generating device.

2. Related Art

In recent years, along with miniaturization in the semiconductor manufacturing process, miniaturization of transfer patterns in photolithography of the semiconductor manufacturing process have been developed rapidly. In the next generation, microfabrication of 20 nm or smaller will be required. Accordingly, it is expected to develop an exposure device in which an extreme ultraviolet (EUV) light generating device that generates extreme ultraviolet (EUV) light having a wavelength of about 13 nm and a reflection reduction projection optical system are combined.

As EUV light generating devices, three types of devices have been proposed, namely an LPP (Laser Produced Plasma) type device that uses plasma generated when a target material is irradiated with laser light, a DPP (Discharge Produced Plasma) type device that uses plasma generated by discharging, and an SR (Synchrotron Radiation) type device that uses orbital radiation light.

CITATION LIST

Patent Literature

Patent Literature 1: Japanese Patent Application Laid-Open No. 2013-004369
Patent Literature 2: International Publication No. WO 2015/082997
Patent Literature 3: Japanese Patent Application Laid-Open No. 2007-273239

SUMMARY

An extreme ultraviolet light generating device according to one aspect of the present disclosure may include a chamber, an EUV light focusing mirror, a gas supplying device, and a discharge device. The EUV light focusing mirror may be provided in the chamber, and include a reflection surface having a concave curved shape and an outer peripheral portion around an outer edge of the reflection surface. The EUV light focusing mirror may be configured to focus EUV light radiated from plasma that is generated when a target is irradiated with laser light. The gas supplying device may include a plurality of peripheral heads. The plurality of peripheral heads may be provided on the outer peripheral portion or along the outer peripheral portion. The plurality of peripheral heads may be configured to blow out a gas flow along the reflection surface. The discharge device may include a discharge path. The discharge path may form a discharge port near the outer peripheral portion. The discharge device may be configured to discharge an ion or a particle, generated together with the plasma, from the discharge port along with the gas flow. The plurality of peripheral heads each may blow out a gas flow flowing from the outer peripheral portion or the vicinity of the outer peripheral portion along the reflection surface, and allow the gas flows to join on the reflection surface having the concave curved shape to thereby form a gas flow flowing along the reflection surface toward the discharge port.

An extreme ultraviolet light generating device according to another aspect of the present disclosure may include a chamber, an EUV light focusing mirror, a gas supplying device, and a discharge device. The EUV light focusing mirror may be provided in the chamber. The EUV light focusing mirror may include a reflection surface having a concave curved shape and an outer peripheral portion around an outer edge of the reflection surface. The EUV light focusing mirror may be configured to focus EUV light radiated from plasma that is generated when a target is irradiated with laser light. The gas supplying device may include a center head and a peripheral head. The center head may be provided in a center portion of the reflection surface and configured to blow out a gas flow along the reflection surface. The peripheral head may be provided on the outer peripheral portion or along the outer peripheral portion and configured to blow out a gas flow along the reflection surface. The discharge device may include a discharge path. The discharge path may form a discharge port near the outer peripheral portion. The discharge device may be configured to discharge an ion or a particle, generated together with the plasma, from the discharge port along with the gas flow. The center head may blow out a gas flow from the center portion toward the discharge port along the reflection surface. To the gas flow, a gas flow blown out by the peripheral head from the outer peripheral portion along the reflection surface may join.

BRIEF DESCRIPTION OF THE DRAWINGS

Some embodiments of the present disclosure will be described below as just examples with reference to the accompanying drawings.

EMBODIMENTS

Hereinafter, embodiments of the present disclosure will be described in detail with reference to the drawings.

The embodiments described below illustrate some examples of the present disclosure, and do not limit the contents of the present disclosure. All of the configurations and the operations described in the embodiments are not always indispensable as configurations and operations of the present disclosure.

It should be noted that the same constituent elements are denoted by the same reference signs, and overlapping description is omitted.

1. Overall description of EUV light generation system
1.1 Configuration
1.2 Operation
2. Terms
3. Problem
3.1 Configuration of comparative example
3.2 Operation of comparative example
3.3 Problem
4. First Embodiment
4.1 Configuration
4.2 Operation
4.3 Effect
5. Second Embodiment
5.1 Configuration
5.2 Operation
5.3 Effect
6. Third Embodiment
6.1 Configuration
6.2 Operation
6.3 Effect
7. Fourth Embodiment
7.1 Configuration
7.2 Operation
7.3 Effect
8. Fifth Embodiment
8.1 Configuration
8.2 Operation
8.3 Effect

1. Overall Description of EUV Light Generation System

[1.1 Configuration]

Figure 1:
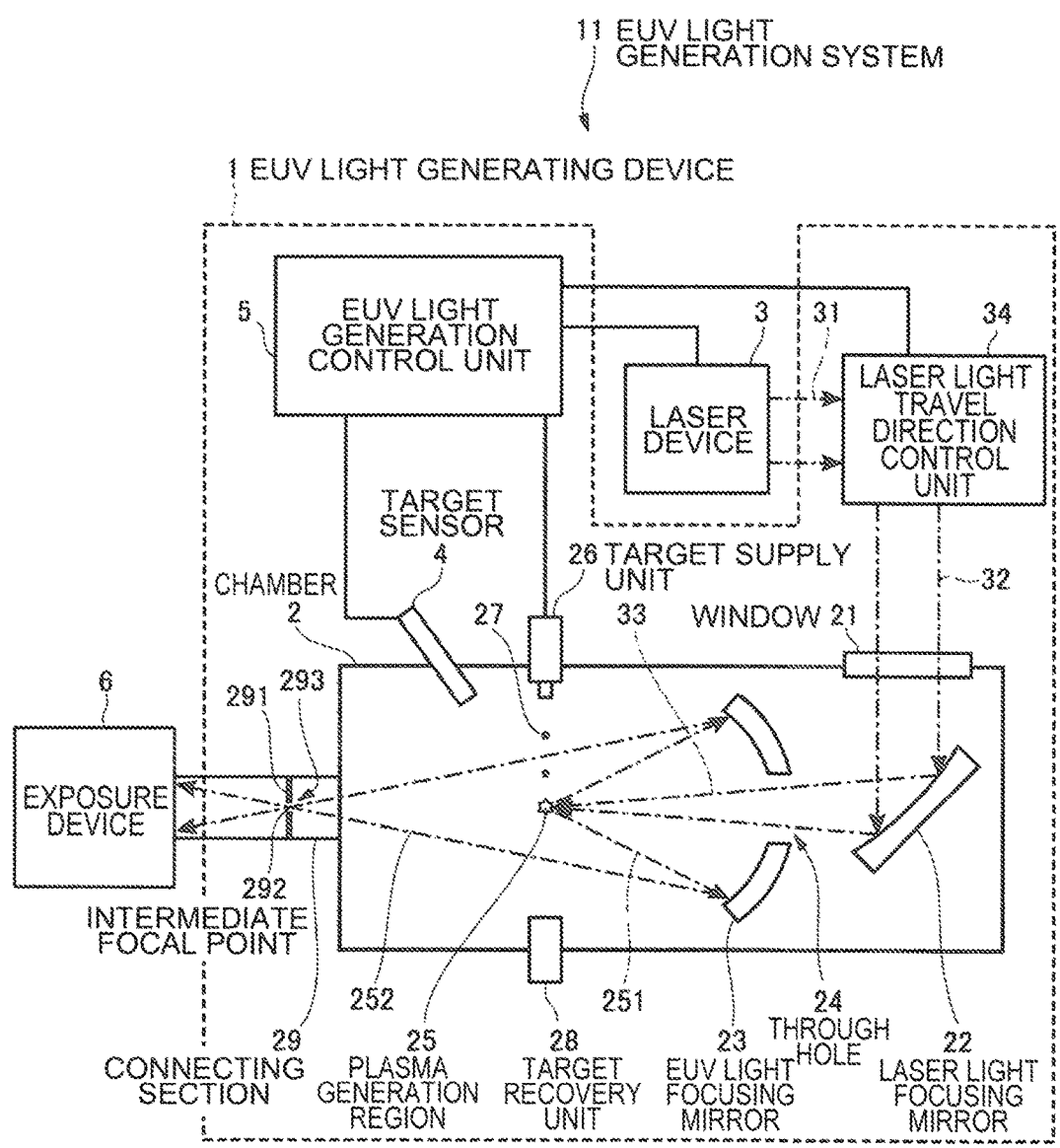
FIG. 1 schematically illustrates a configuration of an exemplary LPP type EUV light generation system.

FIG. 1 schematically illustrates a configuration of an exemplary LPP type EUV light generation system 11.

An EUV light generating device 1 may be used together with at least one laser device 3. In the present application, a system including the EUV light generating device 1 and the laser device 3 is called the EUV light generation system 11.

As illustrated in FIG. 1 and described below in detail, the EUV light generating device 1 may include a chamber 2 and a target supply unit 26. The chamber 2 may be sealable. The target supply unit 26 may be mounted to penetrate a wall of the chamber 2, for example. The material of the target 27 to be supplied from the target supply unit 26 may include, but not be limited to, tin, terbium, gadolinium, lithium, xenon, or a combination of any two or more of them.

A wall of the chamber 2 may have at least one through hole 24. The through hole 24 may be provided with a window 21. Pulse laser light 32 output from the laser device 3 may penetrate the window 21. The inside of the chamber 2 for example may be provided with an EUV light focusing mirror 23 having a spheroidal reflection surface 46. The EUV light focusing mirror 23 may have a first focus and a second focus. On the surface of the EUV light focusing mirror 23, for example, a multilayer reflection film in which molybdenum and silicon are alternately layered may be formed. It is preferable that the EUV light focusing mirror 23 is disposed such that the first focus thereof is positioned in a plasma generation region 25 and the second focus thereof is positioned at an intermediate focal point (IF) 292, for example. A center portion 48 of the EUV light focusing mirror 23 may be provided with a through hole 24 through which pulse laser light 33 may pass.

The EUV light generating device 1 may include an EUV light generation control unit 5, a target sensor 4, and the like. The target sensor 4 may have an image capturing function, and may be configured to detect presence, trajectory, position, velocity, and the like of the target 27.

The EUV light generating device 1 may also include a connecting section 29 that allows the inside of the chamber 2 and the inside of an exposure device 6 to communicate with each other. The inside of the connecting section 29 may be provided with a wall 291 having an aperture 293. The wall 291 may be disposed such that the aperture 293 is positioned at the second focus position of the EUV light focusing mirror 23.

The EUV light generating device 1 may also include a laser light travel direction control unit 34, a laser light focusing mirror 22, a target recovery unit 28 for recovering the target 27, and the like. The laser light travel direction control unit 34 may include an optical element for defining the travel direction of laser light 32, and an actuator for regulating the position, posture, and the like of the optical element.

[1.2 Operation]

Referring to FIG. 1, pulse laser light 31 output from the laser device 3 may pass through the laser light travel direction control unit 34, and then penetrate the window 21 as the pulse laser light 32 and enter the chamber 2. The pulse laser light 32 may travel inside the chamber 2 along at least one optical pass of the laser light, may be reflected by the laser light focusing mirror 22, and may be radiated as the pulse laser light 33 to at least one target 27.

The target supply unit 26 may be configured to output the target 27 toward the plasma generation region 25 in the chamber 2. The target 27 may be irradiated with at least one pulse included in the pulse laser light 33. The target 27 irradiated with the pulse laser light 32 may be made into plasma, and from the plasma, EUV light 251 may be radiated along with radiation of light having another wavelength. The EUV light 251 may be selectively reflected by the EUV light focusing mirror 23. EUV light 252 reflected by the EUV light focusing mirror 23 may be focused at the intermediate focal point 292 and output to the exposure device 6. It should be noted that one target 27 may be irradiated with a plurality of pulses included in the pulse laser light 33.

The EUV light generation control unit 5 may be configured to preside over the control of the entire EUV light generation system 11. The EUV light generation control unit 5 may be configured to process image data or the like of the target 27 captured by the target sensor 4. Further, the EUV light generation control unit 5 may perform at least one of control of the output timing of the target 27 and control of the output direction and the like of the target 27, for example. Furthermore, the EUV light generation control unit 5 may perform at least one of control of the oscillation timing of the laser device 3, control of the travel direction of the pulse laser light 32, and control of the focusing position of the pulse laser light 33, for example. The aforementioned various types of control are mere examples. Other types of control may be added as required.

2. Terms

"Target" is an object to be irradiated with laser light 33 introduced into the chamber 2. The target 27 irradiated with the laser light 32 may be made into plasma and emit EUV light 251.

"Droplet" is a form of the target 27 to be supplied into the chamber 2.

3. Problem

[3.1 Configuration of Comparative Example]

Figure 2:
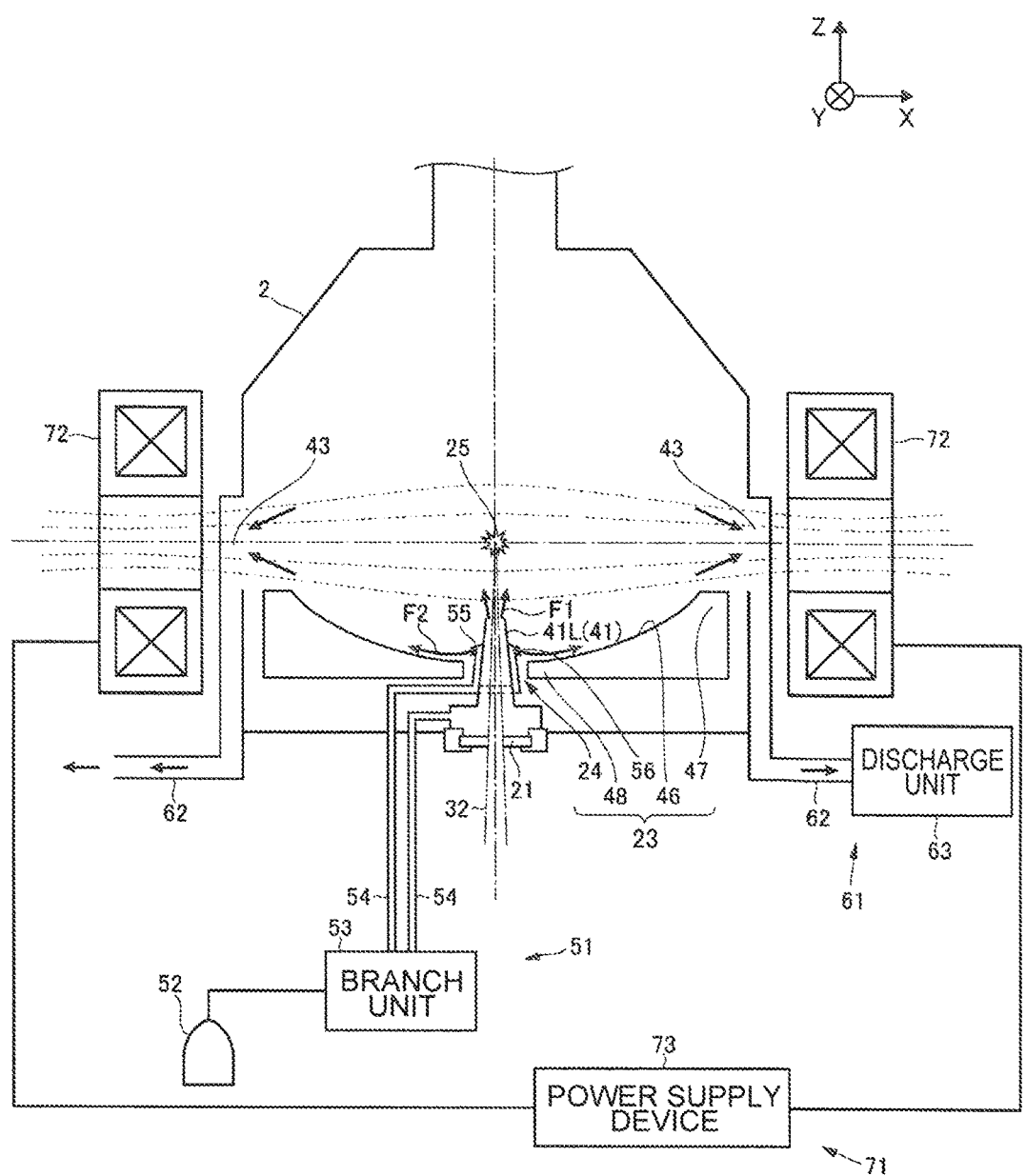
FIG. 2 schematically illustrates a cross-section perpendicular to a Y axis, of a chamber of a comparative example.
Figure 3:
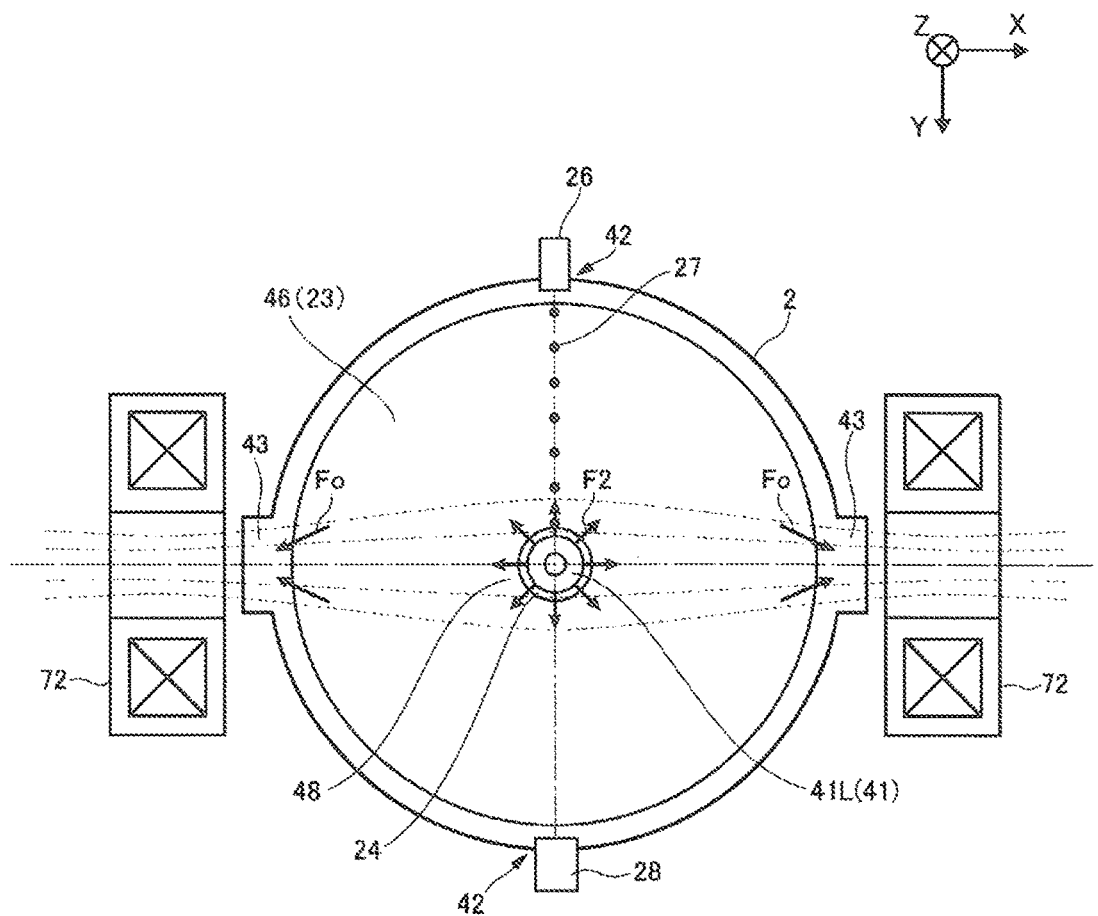
FIG. 3 schematically illustrates a cross-section perpendicular to a Z axis, of the chamber of FIG. 2.

FIGS. 2 and 3 are schematic cross-sectional views illustrating a chamber 2 of a comparative example. FIG. 2 may be a cross-sectional view of the chamber 2 along the Z axis and the X axis, and FIG. 3 may be a cross-sectional view of the chamber 2 along the X axis and the Y axis.

The Z axis may be a direction of deriving the EUV light 252 from the chamber 2 toward the exposure device 6.

The X axis may be a direction along a line segment linking the centers of a pair of discharge ports 43, orthogonal to the Z axis.

The Y axis may be a direction along the trajectory of the target 27 linking the target supply unit 26 and the target recovery unit 28, orthogonal to the X axis and the Z axis.

Even in the subsequent drawings, the coordinate axes may be used based on FIG. 2.

The EUV light generating device 1 may include the chamber 2, the target supply unit 26, the target recovery unit 28, the EUV light focusing mirror 23, a gas supplying device 51, a discharge device 61, and a magnetic field generator 71.

The chamber 2 may isolate the internal space that is decompressed for generating the EUV light 251, from the external environment. The chamber 2 may be formed in a hollow spherical shape, or a hollow cylindrical shape as illustrated in FIG. 2, for example. The center axis direction of the chamber 2 having a hollow cylindrical shape may be an optical path axis direction of the EUV light 251 for deriving the EUV light 252 to the exposure device 6, that is, a direction along the Z axis.

A bottom surface of the cylindrical chamber 2 may have a window 21 for guiding the laser light 32 into the chamber 2.

The window 21 may be made of a material transmitting the pulse laser light 32. The window 21 may be provided on the −Z axis direction side with respect to the plasma generation region 25.

The window 21 may be surrounded by a conical hood 41.

The conical hood 41 may be in an almost truncated conical shape or a conical shape protruding to the inside of the chamber 2 and may be tapered along the optical path of the pulse laser light 32 to be focused. The conical hood 41 may extend from the periphery of the window 21 toward the plasma generation region 25 along the Z axis direction.

A side face of the cylindrical chamber 2 may have a pair of chamber holes 42 having a circular shape. The pair of chamber holes 42 may be formed at opposite positions.

One of the chamber holes 42 may be provided with the target supply unit 26.

The other one of the chamber holes 42 may be provided with the target recovery unit 28.

A line segment linking the centers of the pair of chamber holes 42 may extend along the Y axis, and may be orthogonal to the optical path axis direction of the EUV light 251 along the Z axis in the plasma generation region 25.

A side face of the cylindrical chamber 2 may have a pair of discharge ports 43 having a circular shape. The pair of discharge ports 43 may be formed at opposite positions. A line segment linking the centers of the pair of discharge ports 43 may extend along the X axis, and may be orthogonal to the optical path axis direction of the EUV light 251 along the Z axis in the plasma generation region 25 and a direction of a line segment linking the centers of the pair of chamber holes 42.

The EUV light focusing mirror 23 may be provided inside the chamber 2. The EUV light focusing mirror 23 may be positioned between the plasma generation region 25 and the window 21.

The EUV light focusing mirror 23 may include a reflection surface 46 having a concave curved shape, an outer peripheral portion 47 forming an outer edge around the reflection surface 46, and a through hole 24 penetrating the center portion 48 of the reflection surface 46. The outer peripheral portion 47 may be a side face of the EUV light focusing mirror 23.

The EUV light focusing mirror 23 may be provided between the pair of discharge ports 43 facing each other such that the outer peripheral portion 47 is positioned on the bottom face side of the chamber 2 from the pair of discharge ports 43. The pair of discharge ports 43 may be positioned near the outer peripheral portion 47 of the EUV light focusing mirror 23.

To the through hole 24, the conical hood 41 having an almost truncated conical shape may be inserted, and a tip portion of the conical hood 41 may be protruded from the reflection surface 46 having a concave curved shape.

The gas supplying device 51 may include a gas tank 52, a branch unit 53, a plurality of branch ducts 54, and a center head 55.

The gas tank 52 may store a hydrogen gas.

The branch unit 53 may be connected to the gas tank 52. The branch ducts 54 may be connected with the branch unit 53. The branch unit 53 may branch the hydrogen gas in the gas tank 52 to the respective branch ducts 54. The pressure of the gas branched to each of the branch ducts 54 may be the same.

One of the branch ducts 54 may be connected with the conical hood 41 to supply a hydrogen gas into the conical hood 41. The conical hood 41 may blow out a cone gas flow F1 from the tip thereof into the chamber 2. Thereby, a tin atom or a stannous ion generated together with the EUV light 251 may be less likely to enter the conical hood 41 and less likely to adhere to the window 21.

Another one of the branch ducts 54 may be connected with the center head 55.

The center head 55 may be provided on the whole circumference of the conical hood 41, along the outer periphery of the conical hood 41 having an almost truncated conical shape. The center head 55 may have a slit-like center outlet 56 in the whole circumference of the conical hood 41, or a plurality of center outlets 56 arranged with equal intervals in whole circumference of the conical hood 41. The center outlet 56 may be positioned in the through hole 24 of the reflection surface 46.

The center head 55 positioned in the through hole 24 of the reflection surface 46 may blow off a uniform center gas flow F2 flowing from the center outlet 56 toward the outer peripheral portion 47 along the reflection surface 46 having a concave curved shape. Thereby, particles such as a tin atom and a stannous ion may be less likely to adhere to the reflection surface 46 of the EUV light focusing mirror 23.

The discharge device 61 may include a pair of discharge ducts 62 and a discharge unit 63.

The pair of discharge ducts 62 may connect the pair of discharge ports 43 of the chamber 2 and the discharge unit 63.

The discharge unit 63 may suck the gas in the chamber 2 and discharge it to the outside of the chamber 2. Thereby, the discharge unit 63 may discharge particles such as a tin atom and a stannous ion to the outside of the chamber 2.

The magnetic field generator 71 may include a pair of electromagnetic coils 72 and a power supply device 73.

The electromagnetic coil 72 may be a superconducting magnet having a ring shape. The electromagnetic coil 72 may be connected with the power supply device 73.

The pair of electromagnetic coils 72 may be disposed on outer sides of the pair of discharge ports 43 outside the chamber 2. The pair of electromagnetic coils 72 may be disposed on both sides in the X axis direction with respect to the plasma generation region 25 or the EUV light focusing mirror 23, as with the pair of discharge ports 43. The center axis of the pair of electromagnetic coils 72 may coincide with a line segment linking the centers of the pair of discharge ports 43. By disposing the pair of electromagnetic coils 72 on both outer sides of the chamber 2, a mirror magnetic field may be formed in the chamber 2. It should be noted that the magnetic field formed in the chamber 2 may be a non-axisymmetric magnetic field.

The power supply device 73 may allow electric current to flow to the pair of electromagnetic coils 72. Thereby, a line of magnetic force along the arrangement direction of the pair of discharge ports 43 may be generated between the pair of discharge ports 43. A stannous ion may move along the line of magnetic force.

[3.2 Operation of Comparative Example]

In the comparative example, the discharge device 61 may discharge the chamber 2.

The gas supplying device 51 may blow out a hydrogen gas from the conical hood 41 and the center head 55. The hydrogen gas may be blown out of the tip of the conical hood 41 and the center portion 48 of the EUV light focusing mirror 23, into the chamber 2.

The total flow rate of the hydrogen gas introduced into the chamber 2 may be several slm or higher but several hundreds of slm or lower. Thereby, the hydrogen pressure in the chamber 2 may be maintained at several Pa or higher but several hundreds of Pa or lower.

The magnetic field generator 71 may conduct electricity to the pair of electromagnetic coils 72 to generate a magnetic field of several T or lower in the chamber 2.

The target supply unit 26 may supply a droplet as the target 27 into the chamber 2. The particle diameter of the droplet may be several micrometers or larger but several tens of micrometers or smaller. The droplet may be generated at a frequency of 30 kHz or higher but 100 kHz or lower (30, 40, 50, 60, 70, 80, 90, 100 kHz). The droplet not irradiated with the pulse laser light 32 may move along the Y axis in the chamber 2, and may be recovered by the target recovery unit 28 provided opposite to the target supply unit 26.

The pulse laser light 32 may be introduced into the chamber 2 through the window 21, and pass through the inside of the conical hood 41 provided in the through hole 24 of the EUV light focusing mirror 23. Then, the droplet may be irradiated with the pulse laser light 32, in the plasma generation region 25.

The droplet irradiated with the pulse laser light 32 may be made into plasma, and generate a tin atom, a stannous ion, and light containing the EUV light 251. The EUV light 251 may be focused and reflected by the EUV light focusing mirror 23, travel along the Z axis, and may be output toward the exposure device 6.

The tin atom and the stannous ion generated along with the plasma may form debris and attempt to diffuse in the chamber 2.

The stannous ion may move to both sides of the magnetic field axis with the Lorentz force by the magnetic field, and may be introduced to the pair of discharge ports 43 provided in the direction of the magnetic field axis and discharged to the outside of the chamber 2.

Part of the stannous ion may lose the energy and may be stopped before reaching the discharge port 43 by the collision with the hydrogen gas. The stopped stannous ion may be guided to the pair of discharge ports 43 by a discharge gas flow Fo.

Part of the stannous ion may be neutralized and become a tin atom before reaching the discharge port 43 by the charge exchange reaction with the hydrogen gas. While the tin atom is easily diffused to the surroundings because it is not affected by the force of the magnetic field, it may be guided to the pair of discharge ports 43 by the discharge gas flow Fo.

In this way, the stannous ion may be discharged efficiently from the inside of the chamber 2. On the other hand, the tin atom, not affected by the magnetic field, may be easily diffused to the surroundings in the chamber 2 and may be easily deposited on the surface of the EUV light focusing mirror 23.

Accordingly, in the present embodiment, a hydrogen gas may be used as a gas introduced into the chamber 2. Part of the hydrogen gas introduced into the chamber 2 may be photodissociated by the optical energy of the plasma to become a hydrogen atom having high reactivity, that is, a hydrogen radical.

The hydrogen atom may react with the tin debris deposited on the surface of the EUV light focusing mirror 23. Thereby, the tin debris deposited on the surface of the EUV light focusing mirror 23 may become a volatile stannane gas ($SnH_4$) at an ordinary temperature, and may be removed from the surface of the EUV light focusing mirror 23.

The stannane gas may flow through the surface of the EUV light focusing mirror 23 toward the outer peripheral portion 47 by the center gas flow F2 blown out of the center head 55 provided in the center portion 48 of the EUV light focusing mirror 23, and may be discharged to the outside of the chamber 2 from the pair of discharge ports 43. Thereby, the tin atom can also be discharged from the inside of the chamber 2.

[3.3 Problem]

However, debris may adhere to the reflection surface 46 of the EUV light focusing mirror 23 on a long-term basis.

Figure 4:
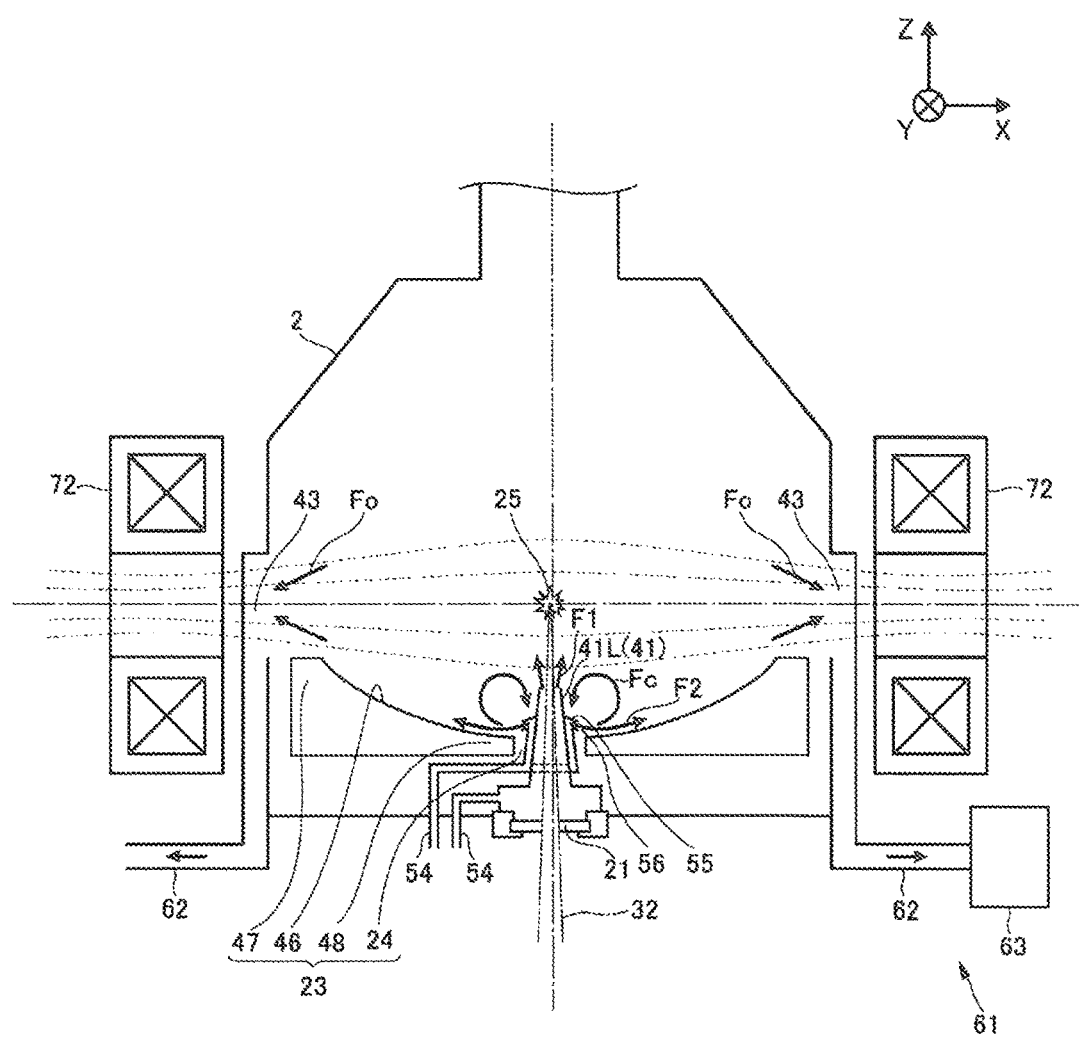
FIG. 4 schematically illustrates a gas flow in the chamber of FIGS. 2 and 3.
Figure 5:
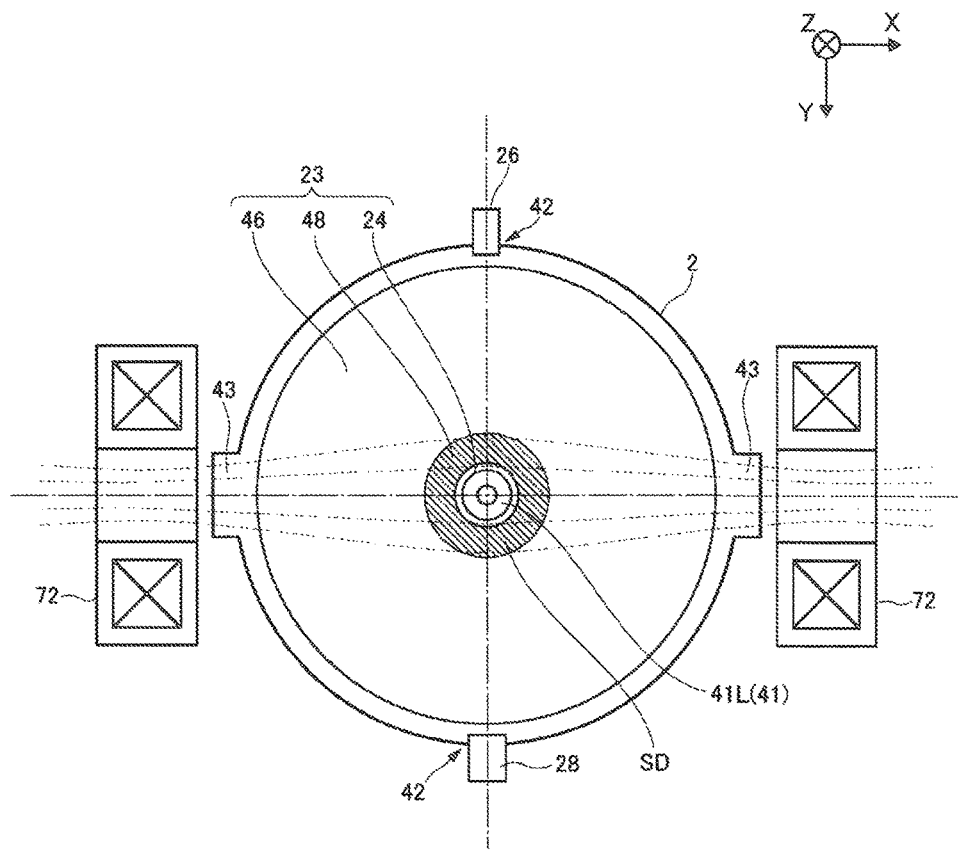
FIG. 5 schematically illustrates a debris adhering state of an EUV light focusing mirror in FIGS. 2 and 3.

FIG. 4 is an illustration of a gas flow in the comparative example. FIG. 5 illustrates an example of a debris adhering state on the reflection surface 46 of the EUV light focusing mirror 23 in the comparative example.

In the comparative example, as illustrated in FIG. 4, the corn gas flow F1 may be blown out of the tip of the conical hood 41, and the center gas flow F2 may be blown out of the center head 55 provided around the conical hood 41. In this case, in the space between the center head 55 and the tip of the conical hood 41, a convection flow Fc of the gas may be generated. The gas may form the convection flow Fc around the tip of the conical hood 41.

Part of the stannane gas may be caught into the convection flow Fc to thereby become less likely to be discharged from the chamber 2. Further, the stannane gas in the convection flow Fc may be brought into contact with the conical hood 41 heated by plasma generation, and may be thermally decomposed. Consequently, the tin atom separated around the tip of the conical hood 41 may adhere to the center portion 48 of the EUV light focusing mirror 23 again, as illustrated in FIG. 5. In this way, as the tin atom adheres to the reflection surface 46 of the EUV light focusing mirror 23 again, a debris deposition region SD may be formed in the center portion 48 of the reflection surface 46 of the EUV light focusing mirror 23 on a long-term basis.

When a tip portion of the conical hood 41 is protruded from the reflection surface 46 having a concave curved shape, the tip of the conical hood 41 may be positioned near the plasma generation region 25. In the tip portion of the conical hood 41 heated by the heat at the time of plasma generation, coolant may be circulated. However, even in that case, the center portion 48 of the conical hood 41 may not be easily cooled. When the surface temperature of the conical hood 41 exceeds 100° C., the stannane gas in contact with the conical hood 41 may be thermally decomposed easily.

In order to suppress thermal decomposition of the stannane gas, it may be possible to increase the flow rate of the gas blown out of the center head 55. However, when the gas flow rate of the center head 55 is increased, the range of the convection flow Fc of the gas around the conical hood 41 may be expanded. As a result, the tin atom generated by thermal decomposition of the stannane gas may adhere not only to the center portion 48 of the reflection surface 46 of the EUV light focusing mirror 23. The tin atom may be diffused and adhere to the surroundings thereof.

4. First Embodiment

[4.1 Configuration]

Figure 6:
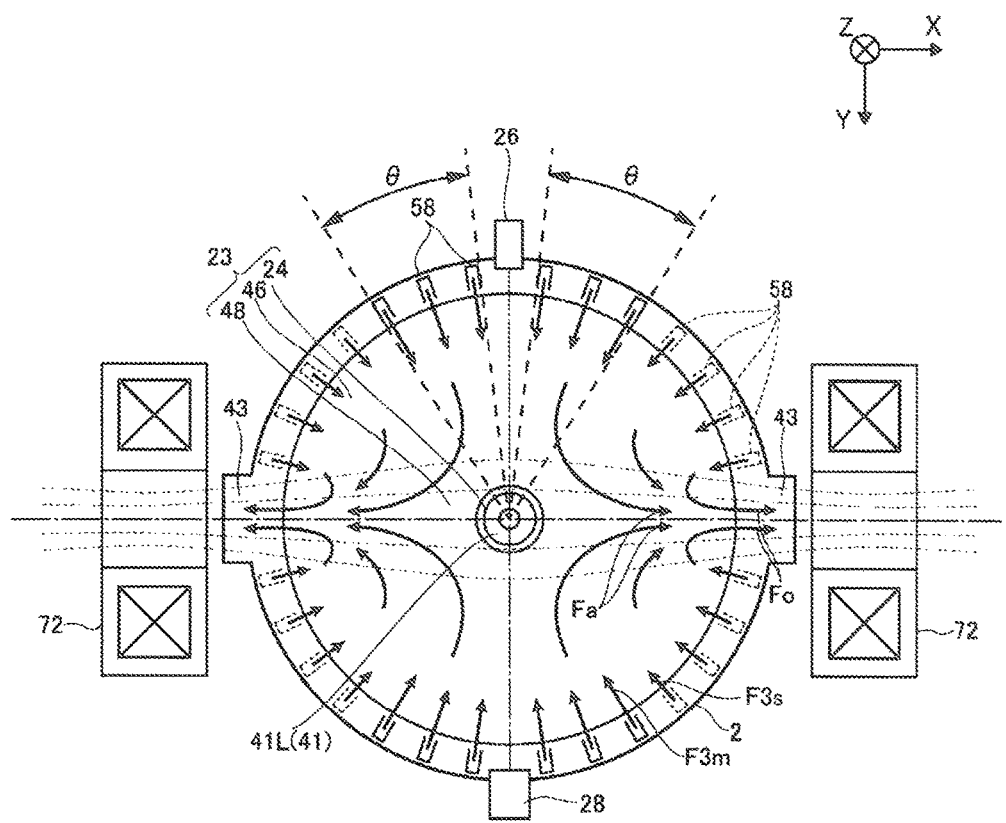
FIG. 6 schematically illustrates a cross-section perpendicular to a Z axis, of a chamber of a first embodiment.
Figure 7:
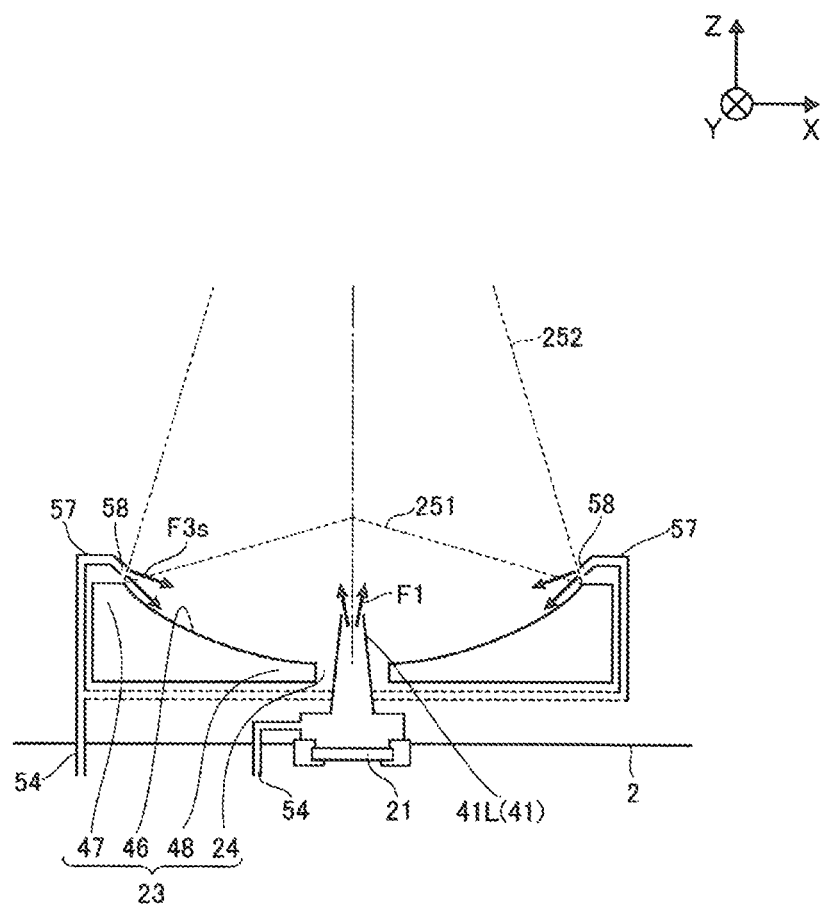
FIG. 7 schematically illustrates a cross-section perpendicular to a Y axis, of the chamber of FIG. 6.

FIGS. 6 and 7 are schematic illustrations of a chamber 2 of a first embodiment. FIG. 6 is a cross-sectional view from the same viewpoint as that of FIG. 3, and FIG. 7 is a partial cross-sectional view from the same viewpoint as that of FIG. 2.

The gas supplying device 51 of the present embodiment may include the gas tank 52, the branch unit 53, a plurality of branch ducts 54, and a peripheral head 57. The present embodiment basically differs from the comparative example in that the center head 55 is not included, and the peripheral head 57 is included instead.

The part common to that of the description provided above is denoted by a common reference sign, and the description thereof is omitted.

The peripheral head 57 may blow out the peripheral gas flow F3 from the outer peripheral portion 47 of the EUV light focusing mirror 23 toward the center portion 48 along the reflection surface 46 having a concave curved shape.

The peripheral head 57 may be provided near the outer peripheral portion 47. The peripheral head 57 may be integrated with the outer peripheral portion 47.

The peripheral head 57 may be provided so as to extend almost all over the circumference of the outer peripheral portion 47 while avoiding the pair of discharge ports 43, the target supply unit 26, and the target recovery unit 28.

The peripheral head 57 may have a plurality of circular peripheral outlets 58 from which the peripheral gas flow F3 along the reflection surface 46 is blown out as illustrated in FIG. 6. The peripheral head 57 may have a slit-like peripheral outlet 58 extending along the outer periphery of the EUV light focusing mirror 23.

The peripheral outlet 58 may be provided toward the center portion 48 of the reflection surface 46 at an angle along the concave curved shape of the reflection surface 46 as illustrated in FIG. 7.

The branch unit 53 may branch the gas to the peripheral outlets 58 of the peripheral head 57. The gas flow rate from the peripheral head 57 may be 10 slm or higher but 100 slm or lower (10, 20, 30, 40, 50, 60, 70, 80, 90, 100 slm). It may also be 20 slm or higher but 40 slm or lower (20, 30, 40 slm).

At that time, the branch unit 53 may form a peripheral main gas flow F3m having a higher velocity, and a peripheral sub gas flow F3s having a velocity lower than that of the peripheral main gas flow F3m, and supply them to the peripheral outlets 58. To the peripheral outlets 58 (broken lines) near the pair of discharge ports 43, the peripheral sub gas flow F3s of a lower velocity may be branched, and to the peripheral outlets 58 (solid lines) near the target supply unit 26 or the target recovery unit 28, the peripheral main gas flow F3m of a higher velocity may be branched. The flow rate of the main gas may preferably be four times or more but ten times of less (four, five, six, seven, eight, nine, ten times) the flow rate of the sub gas, and more preferably, five times or more but seven times or less (five, six, seven times). The peripheral outlet 58 from which the peripheral main gas flow F3$m$ is blown out may be provided within an effective blowout angle θ of 30° as illustrated in FIG. 6.

The effective blowout angle θ means, when the peripheral outlets 58 for the main gas are aligned in a line along the outer periphery, an angle defined by a line segment linking the outer edge of the peripheral outlet 58 at one end and the center of the EUV light focusing mirror 23, and a line segment linking the outer edge of the peripheral outlet 58 at the other end and the center of the EUV light focusing mirror 23.

As an example, the effective blowout angle θ may be defined for the plurality of peripheral outlets 58 for the main gas arranged on the right side of the target supply unit 26 of FIG. 6. In this case, an angle from the peripheral outlet 58 of the immediately right side of the target supply unit 26 to the peripheral outlet 58 adjacent to the peripheral outlet 58 for the peripheral sub gas flow F3$s$ may be the effective blowout angle θ. In FIG. 6, the effective blowout angle θ may be defined similarly for the peripheral outlets 58 for the main gas arranged on the left side of the target supply unit 26, on the right side of the target recovery unit 28, and on the left side of the target recovery unit 28.

[4.2 Operation]

The gas supplying device 51 may blow out the hydrogen gas from the tip of the conical hood 41 and the peripheral head 57, as illustrated in FIG. 7.

The peripheral head 57 may blow out the peripheral gas flow F3 from the peripheral outlets 58 arranged along the outer peripheral portion 47 of the EUV light focusing mirror 23 toward the reflection surface 46 of the EUV light focusing mirror 23.

Among the peripheral outlets 58, the peripheral outlet 58 near the Y axis perpendicular to the arrangement direction of the pair of discharge ports 43 may blow out the peripheral main gas flow F3$m$ having a higher velocity than that blown out of the peripheral outlet 58 near the pair of discharge ports 43.

On the reflection surface 46 having a concave curved shape of the EUV light focusing mirror 23, a plurality of peripheral gas flows F3 may flow from the outer peripheral portion 47 toward the center portion 48 along the reflection surface 46, as illustrated in FIG. 6.

The peripheral gas flows F3 may join in the center portion 48 of the reflection surface 46.

On the reflection surface 46 having a concave curved shape, a composite gas flow Fa flowing from the center portion 48 toward the pair of discharge ports 43 along the reflection surface 46 may be formed mainly by the peripheral main gas flow F3$m$.

The peripheral sub gas flow F3$s$ may join the composite gas flow Fa.

Figure 8:
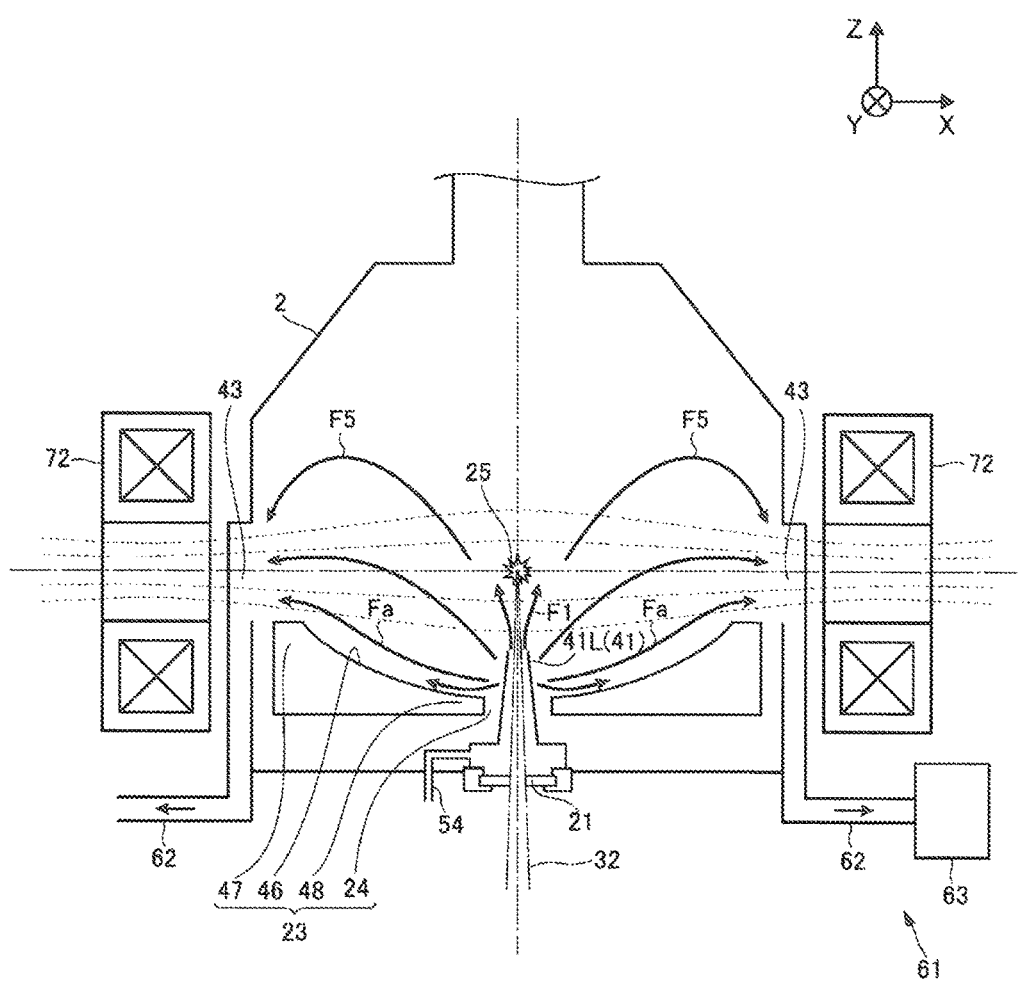
FIG. 8 schematically illustrates a gas flow in a direction perpendicular to the Y axis in the chamber of FIGS. 6 and 7.
Figure 9:
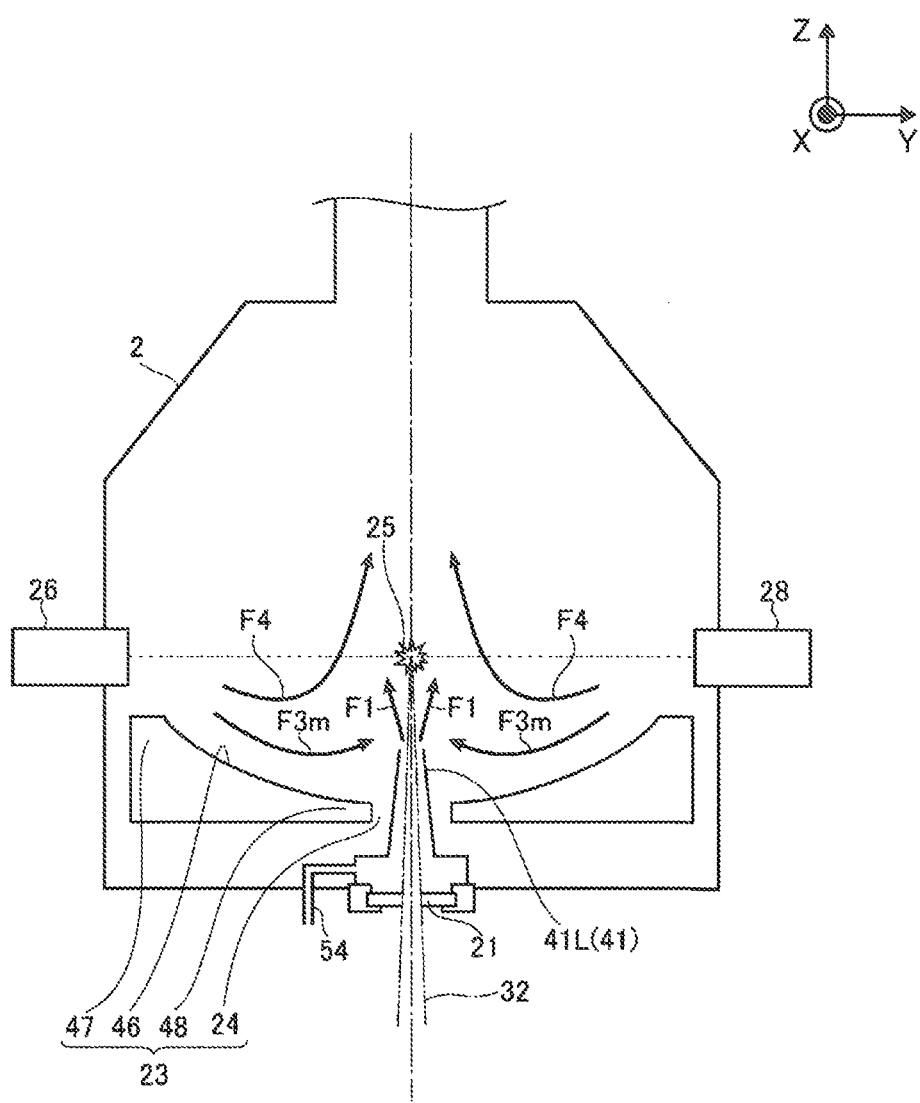
FIG. 9 schematically illustrates a gas flow in a direction perpendicular to an X axis in the chamber of FIGS. 6 and 7.

FIGS. 8 and 9 illustrate a gas flow in the chamber 2. FIG. 8 is a cross-sectional view from the same viewpoint as that of FIG. 4, and FIG. 9 is a cross-sectional view taken along the Z axis and the Y axis of FIG. 6.

As illustrated in FIG. 9, the peripheral main gas flow F3$m$ may flow from the outer peripheral portion 47 in the Y axis direction toward the center portion 48 along the concave curved shape of the reflection surface 46.

Further, even in the space away from the reflection surface 46, a first separated gas flow F4 in a direction along the peripheral main gas flow F3$m$ may be formed in the chamber 2, which may preferably join the upward cone gas flow F1 by the conical hood 41.

As illustrated in FIG. 8, the composite gas flow Fa may flow from the center portion 48 toward the outer peripheral portion 47 in the X axis direction along the concave curved shape of the reflection surface 46.

Further, even in the space separated from the reflection surface 46, a second separated gas flow F5 in a direction along the composite gas flow Fa may be generated in the chamber 2.

[4.3 Effect]

Figure 10:
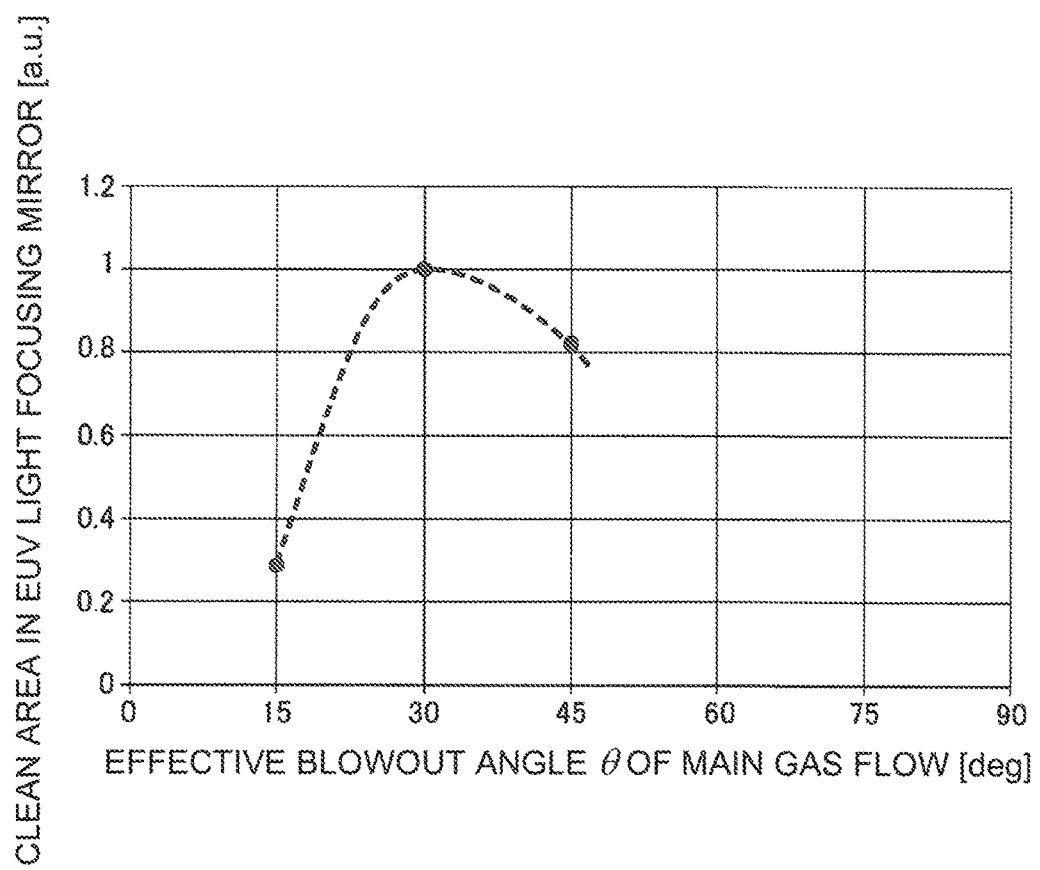
FIG. 10 illustrates an exemplary relationship between an effective blowout angle of a peripheral main gas flow and a clean area of an EUV light focusing mirror.

FIG. 10 is a characteristic diagram illustrating an exemplary relationship between the effective blowout angle θ of the peripheral main gas flow F3$m$ and a clean area of the EUV light focusing mirror 23. The horizontal axis may represent the effective blowout angle θ of the peripheral main gas flow F3$m$ on the basis of the Y axis. The vertical axis may represent a value calculated by dividing the area of the clean area of the EUV light focusing mirror 23 by the effective area of the reflection surface 46.

Figure 11:
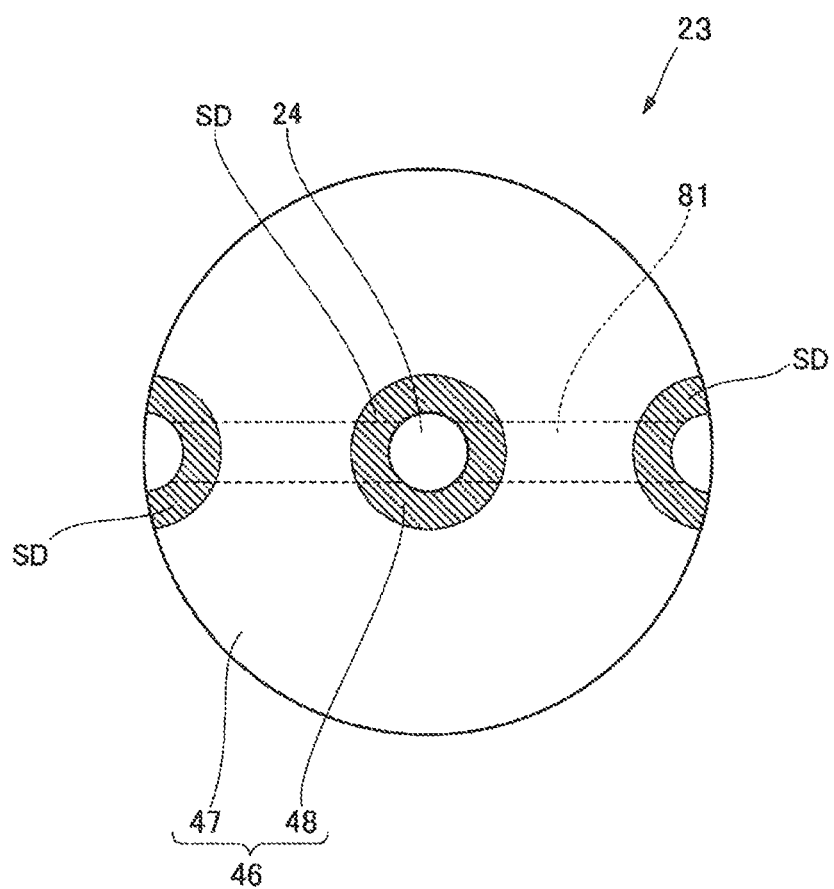
FIG. 11 illustrates an exemplary definition of a clean area of an EUV light focusing mirror.

FIG. 11 illustrates an exemplary definition of the clean area of the EUV light focusing mirror 23. In FIG. 11, the reflection surface 46 of the EUV light focusing mirror 23 may be developed on an almost disk-shaped plane, and a circular through hole 24 may be developed in a planar manner at the center. In the EUV light focusing mirror 23 of FIG. 11, an obscuration region 81 not to be used for exposure as a region between two broken lines, of the reflection surface 46, may be illustrated. In this case, the clean area may be calculated for an effective area obtained by subtracting the area of the through hole 24 and the area of the obscuration region 81 from the area of the reflection surface 46. Then, a value calculated by dividing an area to which debris does not adhere in the effective area, by the effective area, may be the value of the clean area on the vertical axis of FIG. 10.

FIG. 11 may illustrate a debris adhering region in the comparative example. In the comparative example, debris may adhere to a portion surrounding the pair of discharge ports 43 and to the center portion 48. The value of the clean area in the comparative example is decreased according to the area of the contaminated region in the effective area, and the area of the clean area may become a value smaller than 1.

Meanwhile, as illustrated in FIG. 10, in the present embodiment, when the effective blowout angle θ of the peripheral main gas flow F3$m$ is 30°, for example, the value of the clean area may become almost 1. The fact that the value of the clean area is 1 may mean that debris does not adhere in the effective area of FIG. 10.

When the effective blowout angle θ of the peripheral main gas flow F3$m$ is 20° or larger but 45° or smaller (20, 25, 30, 35, 40, 45°) for example, the value of the clean area may be 0.6 or larger.

When the effective blowout angle θ of the peripheral main gas flow F3$m$ is 25° or larger but 45° or smaller (25, 30, 35, 40, 45°) for example, the value of the clean area may be 0.8 or larger.

Figure 12:
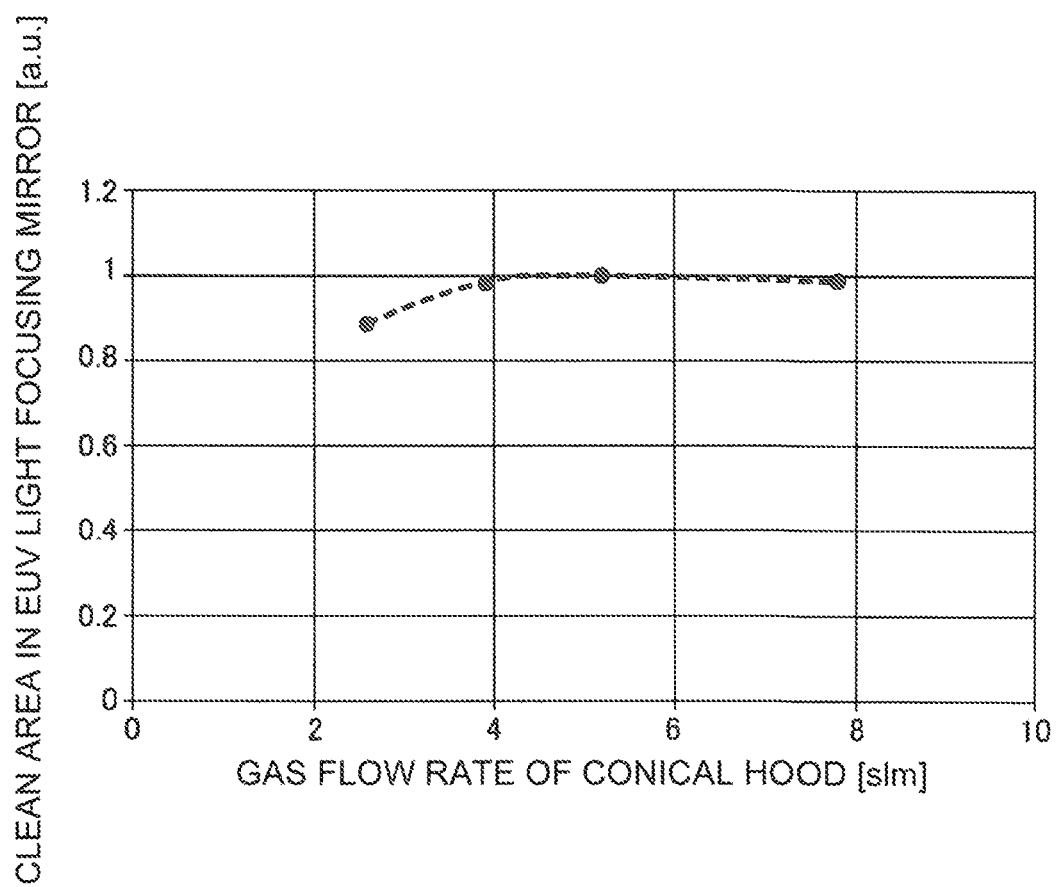
FIG. 12 illustrates an exemplary relationship between a gas flow rate of a conical hood and a clean area of an EUV light focusing mirror.

FIG. 12 is a characteristic diagram illustrating an exemplary relationship between the gas flow rate of the conical hood 41 and the clean area of the EUV light focusing mirror 23. The horizontal axis may represent a value of the gas flow rate of the conical hood 41. The vertical axis may represent a value calculated by dividing the area of the clean area of the EUV light focusing mirror 23 by the effective area of the reflection surface 46.

As illustrated FIG. 12, the clean area of the EUV light focusing mirror 23 may vary by being affected by the flow rate of the conical hood 41.

From FIG. 12, in the present embodiment, the flow rate of the conical hood 41 may be 4 slm or higher but 7 slm or lower (4, 5, 6, 7 slm). Thereby, a value of 0.95 or larger may be secured as the clean area of the EUV light focusing mirror 23.

Figure 13:
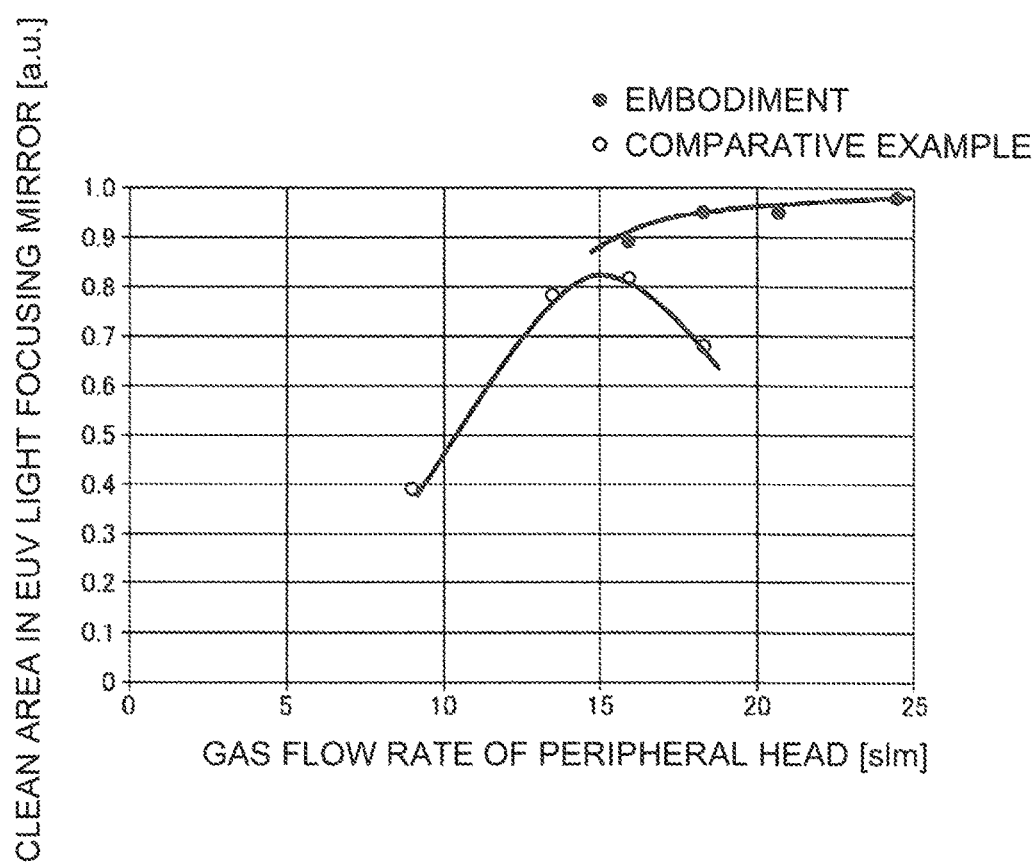
FIG. 13 illustrates an exemplary relationship between a gas flow rate of a peripheral head and a clean area of an EUV light focusing mirror.

FIG. 13 is a characteristic diagram illustrating an exemplary relationship between the gas flow rate of the peripheral head 57 and the clean area of the EUV light focusing mirror 23. The horizontal axis may represent a value of the gas flow rate of the peripheral head 57. The vertical axis may represent a value calculated by dividing the area of the clean area of the EUV light focusing mirror 23 by the effective area of the reflection surface 46.

As illustrated in FIG. 13, the clean area of the EUV light focusing mirror 23 may vary depending on the flow rate of the peripheral head 57.

In the comparative example, when the flow rate is increased to 15 slm or higher, the clean area is rather decreased. However, in the present embodiment, even when the flow rate is in increased to 15 slm or higher, the clean area may be increased in a high-value range of 0.85 or higher. Accordingly, in the present embodiment, it is possible to effectively maintain the proportion of the clean area at a high value state even when the gas flow rate of the peripheral head 57 is increased. The proportion of the clean area may be improved.

From FIG. 13, in the present embodiment, when the gas flow rate of the peripheral head 57 is 15 sim or higher but 25 slm or lower (15, 20, 25 slm), the value of the clean area can be 0.85 or higher.

As described above, in the present embodiment, the gas may be less likely to form a convection flow around the tip portion of the conical hood 41. Heat decomposition of the stannane gas caused by a contact to the tip portion of the conical hood 41 can be suppressed. Readhesion of the tin atom in the center portion 48 of the EUV light focusing mirror 23 can be suppressed. Contamination of the center portion 48 of the EUV light focusing mirror 23 can be suppressed even on a long-term basis.

As described above, in the present embodiment, as the peripheral gas flow F3 is supplied from the outer peripheral portion 47 to the reflection surface 46 having a concave curved shape, the convection flow Fc may be less likely to be generated around the conical hood 41 in the center portion 48 of the EUV light focusing mirror 23 as in the case of the comparative example. In the present embodiment, contamination of the center portion 48 of the EUV light focusing mirror 23 can be suppressed. In the present embodiment, debris such as a tin atom may be less likely to be deposited on the center portion 48 of the EUV light focusing mirror 23.

Further, in the present embodiment, even though the flow rate in the peripheral head 57 is increased, the gas flow on the reflection surface 46 of the EUV light focusing mirror 23 may not be changed, and the flow velocity may be increased simply. In the present embodiment, the debris discharge performance from the inside of the chamber 2 can be improved, and the clean area of the EUV light focusing mirror 23 can be increased.

5. Second Embodiment

In the present embodiment, a specific example of the peripheral head 57 that can be used for the gas supplying device 51 of the first embodiment will be described.

The part common to that of the description provided above is denoted by a common reference sign, and the description thereof is omitted.

[5.1 Configuration]

FIGS. 14 to 18 illustrate a specific example of the peripheral head 57.

Figure 14:
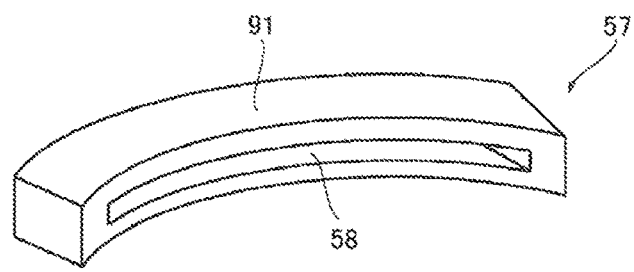
FIG. 14 schematically illustrates a peripheral head with a slit-like peripheral outlet in a second embodiment.

The peripheral head 57 of FIG. 14 may be obtained by forming a slit-like peripheral outlet 58 in a long head body 91 curved along the outer periphery of the EUV light focusing mirror 23. The slit-like peripheral outlet 58 may be formed in the extending direction of the long head body 91. By providing a plurality of such peripheral heads 57 along the outer peripheral portion 47 of the EUV light focusing mirror 23, the respective slit-like peripheral outlets 58 may be arranged along the outer peripheral direction of the reflection surface 46.

Figure 15:
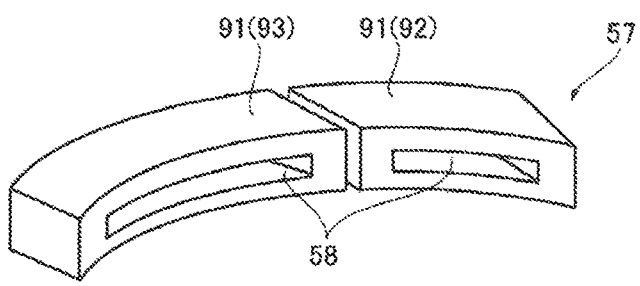
FIG. 15 schematically illustrates a peripheral head with a slit-like peripheral outlet in each of a plurality of divided heads.

The peripheral head 57 of FIG. 15 includes a main divided head 92 that is curved along the outer periphery of the EUV light focusing mirror 23 and that blows out a peripheral main gas flow F3$m$, and a sub divided head 93 that is curved along the outer periphery of the EUV light focusing mirror 23 and that blows out a peripheral sub gas flow F3$s$. Each of the main divided head 92 and the sub divided head 93 may have the slit-like peripheral outlet 58 in the head body. In the present embodiment, as the main divided head 92 and the sub divided head 93 are separated as described above, the peripheral main gas flow F3$m$ and the peripheral sub gas flow F3$s$ each having a different velocity may be supplied individually to the respective divided heads.

Figure 16:
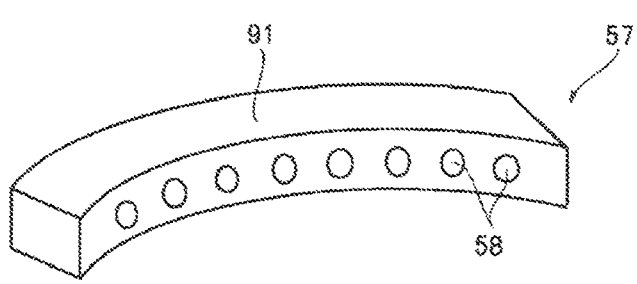
FIG. 16 schematically illustrates a peripheral head in which a plurality of peripheral outlets are arranged.

The peripheral head 57 of FIG. 16 may be obtained by forming a plurality of peripheral outlets 58 in the long head body 91 curved along the outer periphery of the EUV light focusing mirror 23. The plurality of peripheral outlets 58 may be arranged with equal intervals in the extending direction of the long head body 91. In the present embodiment, since the peripheral head 57 is arranged along the outer peripheral portion 47 of the EUV light focusing mirror 23, the peripheral outlets 58 may be arranged along the outer peripheral direction of the reflection surface 46.

Figure 17:
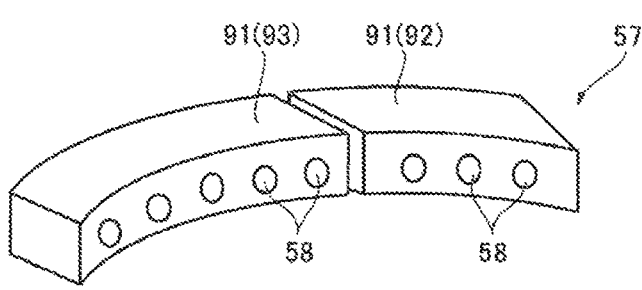
FIG. 17 schematically illustrates a peripheral head in which a plurality of peripheral outlets are arranged in a plurality of divided heads.

The peripheral head 57 of FIG. 17 may include the main divided head 92 that is curved along the outer periphery of the EUV light focusing mirror 23 and that blows out the peripheral main gas flow F3$m$, and the sub divided head 93 that is curved along the outer periphery of the EUV light focusing mirror 23 and that blows out the peripheral sub gas flow F3$s$. Each of the main divided head 92 and the sub divided head 93 may be obtained by forming a plurality of peripheral outlets 58 in each head body 91. The peripheral outlets 58 may be arranged with equal intervals in the extending direction of the head body 91. In the present embodiment, as the main divided head 92 and the sub divided head 93 are separated, the peripheral main gas flow F3$m$ and the peripheral sub gas flow F3$s$ each having a different velocity may be supplied individually to the respective divided heads.

Figure 18:
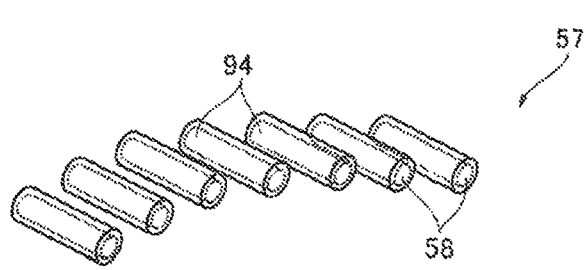
FIG. 18 schematically illustrates a peripheral head having a plurality of cylindrical nozzles.

In FIG. 18, the peripheral head 57 may be configured of a plurality of cylindrical nozzles 94. Each of the cylindrical nozzles 94 may have the peripheral outlet 58. In the present embodiment, as the cylindrical nozzles 94 are arranged with equal intervals along the outer peripheral portion 47 of the EUV light focusing mirror 23, the peripheral outlets 58 may be arranged along the outer peripheral direction of the reflection surface 46.

In comparison among the peripheral heads 57 of FIGS. 14 to 18, the peripheral outlet 58 in the peripheral head 57 of FIG. 14 may extend along the peripheral direction of the reflection surface 46. As such, compared with the discretely provided circular peripheral outlets 58 of FIG. 16 or 18, the peripheral gas flow F3 may be blown out continuously from the entire periphery of the reflection surface 46.

In the peripheral head 57 of FIGS. 14 and 16, since the discharge ports 43 are integrally formed, they may be positioned altogether. Compared with the tube-type peripheral head 57 using the cylindrical nozzle 94 of FIG. 18, the mounting operation may be easier.

As the peripheral head 57 of FIG. 15 or 17 is configured of a plurality of separated divided heads, it is possible to supply the gas having a different velocity individually. Thereby, it is possible to allow the peripheral main gas flow F3$m$ and the peripheral sub gas flow F3$s$ having different velocities to be blown out easily.

Figure 19:
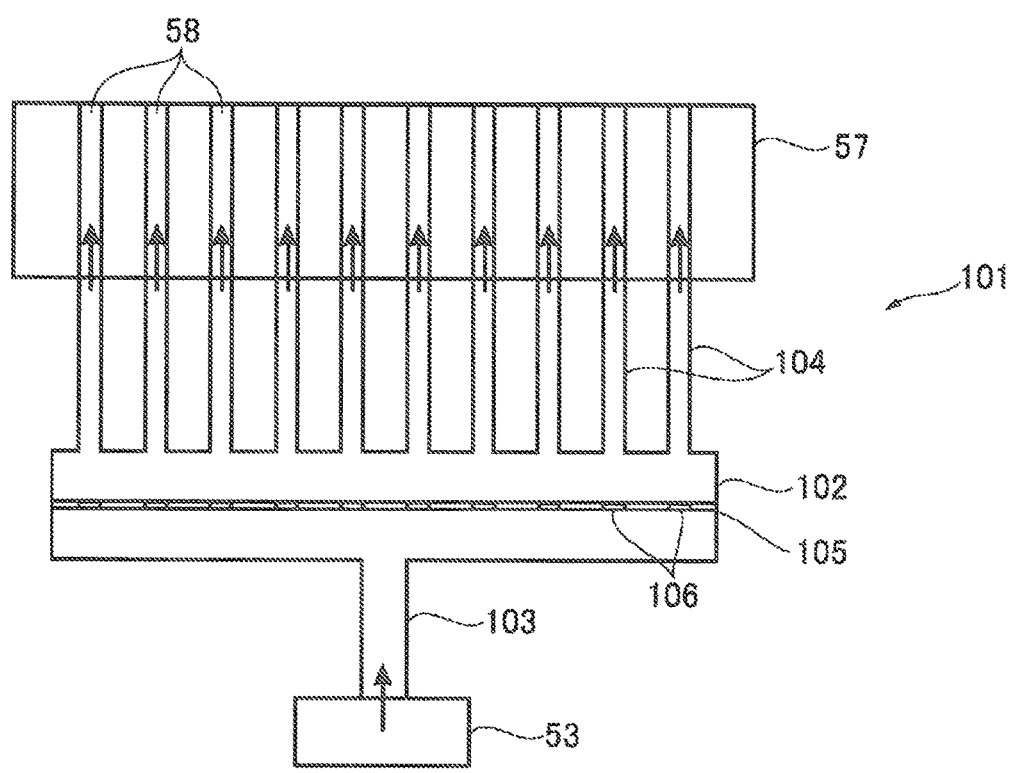
FIG. 19 schematically illustrates a branch chamber.

FIG. 19 illustrates an exemplary schematic diagram of a branch chamber 101 connected between the branch unit 53 and the peripheral head 57 in the gas supplying device 51.

The branch chamber 101 of FIG. 19 may include a chamber body 102, a gas inlet port 103, a plurality of gas outlet ports 104, and a gas distribution plate 105.

The chamber body 102 may be formed in a hollow almost cubic shape. The gas inlet port 103 and the gas outlet ports 104 may be formed to protrude from side faces, opposite to each other, of the chamber body 102 having an almost cubic shape, and may communicate with the internal space of the chamber body 102. The gas distribution plate 105 may separate the internal space of the chamber body 102 into a space on the gas inlet port 103 side and a space on the gas outlet ports 104 side.

The plurality of gas outlet ports 104 may be connected with the peripheral head 57. The number of the gas outlet ports 104 may be the same as that of the peripheral outlets 58 of the peripheral head 57, for example. The gas outlet ports 104 may be connected with the peripheral outlets 58 on a one-to-one basis.

The gas inlet port 103 may be connected with the branch unit 53.

The gas distribution plate 105 may be a thin metal plate with a plurality of vent holes 106. The vent hole 106 may be 0.5 mmφ so as to generate an appropriate pressure loss. The number of the vent holes 106 may be the same as or less than that of the gas outlet ports 104. The vent holes 106 may be formed at positions corresponding to the respective gas outlet ports 104 on a one-to-one basis.

The branch chamber 101 may branch the gas on which a pressure equalization process is performed to apply an equal pressure to the connected peripheral outlets 58.

Figure 20:
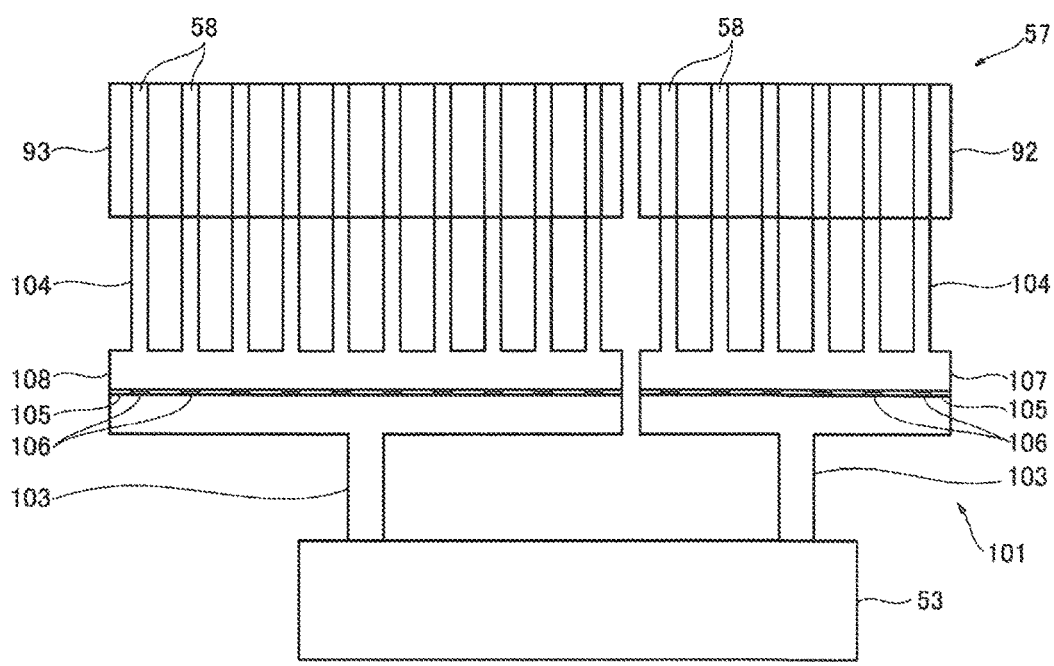
FIG. 20 schematically illustrates a branch chamber having a plurality of chamber bodies.

FIG. 20 is an example of a schematic configuration diagram of the branch chamber 101 for branching the peripheral main gas flow F3$m$ and the peripheral sub gas flow F3$s$ having different flow rates.

The branch chamber 101 of FIG. 20 may include a main chamber body 107, a sub chamber body 108, a plurality of gas inlet ports 103, a plurality of gas outlet ports 104, and a plurality of gas distribution plates 105.

The configurations of the gas inlet port 103, the gas outlet ports 104, and the gas distribution plate 105 of the main chamber body 107, and the configurations of the gas inlet port 103, the gas outlet ports 104, and the gas distribution plate 105 of the sub chamber body 108 are the same as those of FIG. 19.

In the present embodiment, the branch chamber 101 connected with the peripheral head 57 is configured of divided chamber bodies 107 and 108. Accordingly, with respect to the peripheral outlets 58, it is possible to supply gas flows of different flow rates on each of which a pressure equalization process is performed individually in the respective chamber bodies 107 and 108.

[5.2 Operation]

The peripheral heads 57 of FIGS. 14 to 18 each may be used as the peripheral head 57 of the first embodiment.

The branch chambers 101 of FIGS. 19 and 20 each may be used for branching the gas to the peripheral outlets 58 of the peripheral head 57.

Description will be given on a combination of the peripheral head 57 of FIG. 17 and the branch chamber 101 of FIG. 20, as an example. Between the main divided head 92 and the branch unit 53, the main chamber body 107 may be connected. Further, between the sub divided head 93 and the branch unit 53, the sub chamber body 108 may be connected.

In this case, the gas flow branched by the branch unit 53 may be branched to the respective peripheral outlets 58 from which the peripheral main gas flow F3$m$ is blown out in the main chamber body 107, and may be supplied to the main divided head 92.

The gas flow branched by the branch unit 53 may be branched to the respective peripheral outlets 58 from which the peripheral sub gas flow F3$s$ is blown out in the sub chamber body 108, and may be supplied to the sub divided head 93. At this time, the flow rate of the gas to be supplied to the main chamber body 107 may be higher than the flow rate of the gas to be supplied to the sub chamber body 108. For example, the inner diameter of the gas inlet port 103 to be connected with the main chamber body 107 may be larger than the inner diameter of the gas inlet port 103 to be connected with the sub chamber body 108. Further, the inner diameter of the gas outlet ports 104 to be connected with the main divided head 92 may be larger than the inner diameter of the gas outlet ports 104 to be connected with the sub divided head 93. Each of the gas inlet ports 103 may be provided with a needle valve or the like (not illustrated). The opening of each needle valve may be different. As a result, the peripheral main gas flow F3$m$ may be faster than the peripheral sub gas flow F3$s$. It is preferable that the main gas flow rate is 8 slm or higher but 55 slm or lower (8, 10, 20, 30, 40, 50, 55 slm), and that the sub gas flow rate is 1 slm or higher but 6 slm or lower (1, 2, 3, 4, 5, 6 slm). It is more preferable that the main gas flow rate is 16 slm or higher but 35 slm or lower (16, 20, 25, 30, 35 slm), and that the sub gas flow rate is 2 slm or higher but 7 slm or lower (2, 3, 4, 5, 6, 7 slm).

[5.3 Effect]

In the present embodiment, it is possible to supply a gas flow on which a pressure equalization process is performed and which is branched in the branch chamber 101, to the peripheral head 57.

Further, the main gas flow rate can be higher than the sub gas flow rate with a simple configuration.

6. Third Embodiment

In the present embodiment, description will be given on an example in which a position sensor 7 or the like is provided near the outer peripheral portion 47 of the EUV light focusing mirror 23, and the peripheral outlets 58 of the peripheral head 57 are arranged while avoiding the position sensor 7.

The part common to that of the description provided above is denoted by a common reference sign, and the description thereof is omitted.

[6.1 Configuration]

Figure 21:
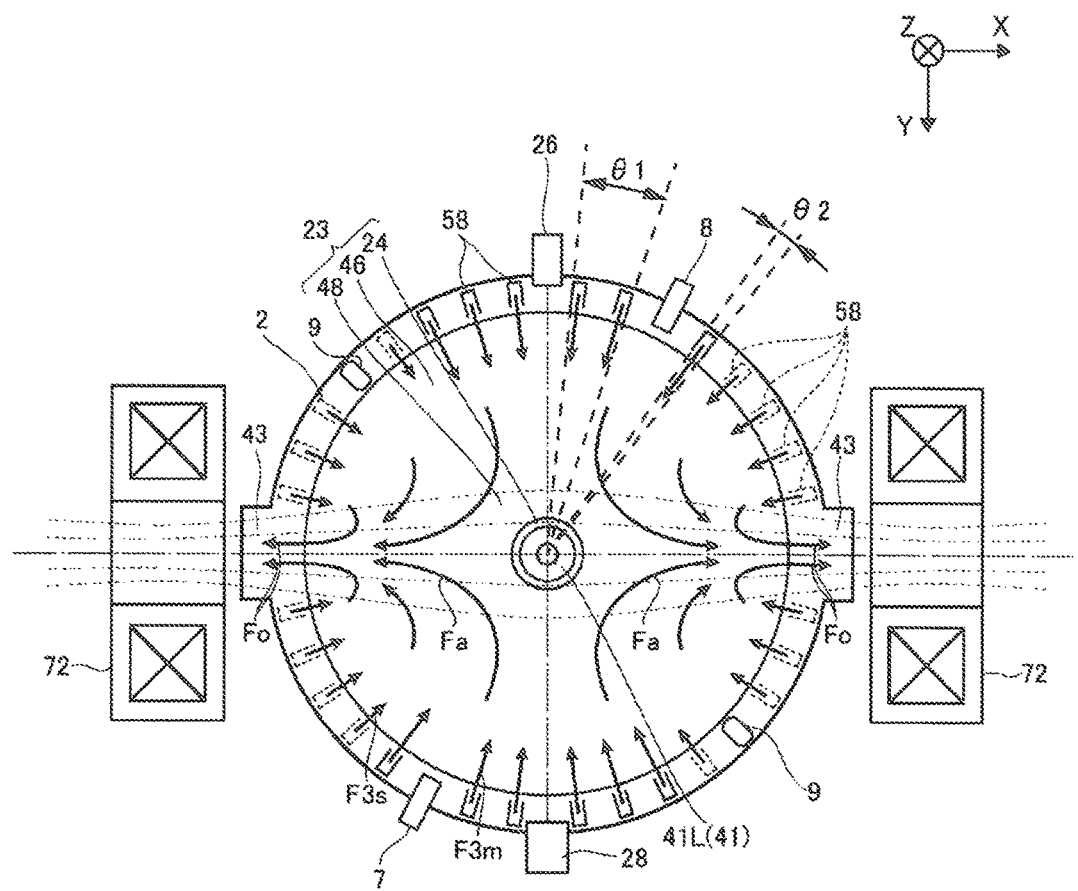
FIG. 21 schematically illustrates a cross-section perpendicular to a Z axis, of a chamber of a third embodiment.

FIG. 21 is a schematic illustration of a chamber 2 of the third embodiment. FIG. 21 may be a cross-sectional view from the same viewpoint as that of FIG. 6.

In the chamber 2 of FIG. 21, the position sensor 7, a position sensor light source 8, an energy measurement sensor 9, and the like may be provided near the outer peripheral portion 47 of the EUV light focusing mirror 23, in addition to the pair of discharge ports 43, the target supply unit 26, and the target recovery unit 28.

The position sensor 7 may be a sensor that detects a position of a droplet supplied to the plasma generation region 25.

The position sensor light source 8 may radiate light to a detection position of a droplet by the position sensor 7. The position sensor light source 8 may be disposed to face the position sensor 7 with the droplet detection position being interposed between them.

The position sensor 7 may detect the position of a droplet based on a captured image of the droplet passing through the detection position.

The energy measurement sensor 9 may measure the energy of the EUV light 251 generated in the plasma generation region 25.

These sensors 7 to 9 may detect a droplet supplied to the plasma generation region 25 and the EUV light 251 generated in the plasma generation region 25. Accordingly, it is desirable to provide the sensors 7 to 9 near the plasma generation region 25 as much as possible from the viewpoint of detection accuracy or the like. As such, these sensors 7 to 9 may be disposed near the outer peripheral portion 47 of the EUV light focusing mirror 23.

As described above, since a peripheral member such as the position sensor 7 is disposed near the outer peripheral portion 47 of the EUV light focusing mirror 23, the peripheral head 57 and the peripheral outlets 58 may be disposed almost all over the circumference of the outer peripheral portion 47 while avoiding the places where such peripheral members are provided.

Then, in order to suitably form the composite gas flow Fa toward the pair of discharge ports 43 on the reflection surface 46 of the EUV light focusing mirror 23 by the peripheral gas flow F3 of the peripheral outlets 58 of the peripheral head 57, it may be necessary to secure a flow path of the peripheral main gas flow F3m.

Accordingly, in the present embodiment, an angle for arranging the peripheral outlets 58 from which the peripheral main gas flow F3m is blown out may be secured in the peripheral head 57.

In FIG. 21, the peripheral outlets 58 from which the peripheral main gas flow F3m is blown out may be provided on both right and left sides of the target supply unit 26 and on both right and left sides of the target recovery unit 28.

In this case, on the right side of the target supply unit 26 of FIG. 21, the plurality of peripheral outlets 58 may be provided while avoiding the target supply unit 26 and the position sensor light source 8.

For example, on the right side of the target supply unit 26 in FIG. 21, the plurality of peripheral outlets 58 from which the peripheral main gas flows F3m are blown out may be provided between the target supply unit 26 and the position sensor light source 8, and on the right outer side of the position sensor light source 8.

Even in this case, the plurality of peripheral outlets 58 from which the peripheral main gas flows F3m are blown out may be provided within a range of the effective blowout angle θ of at least 20° or larger but 45° or smaller (20, 25, 30, 35, 40, 45°). It is preferable that the plurality of peripheral outlet 58 may be provided at the effective blowout angle θ of 30°.

In FIG. 21, the position sensor light source 8 may be provided on the right side of the target supply unit 26. In this case, the effective blowout angle θ may mean an angle calculated by subtracting, from an angle defined by a line segment linking the outer edge of the peripheral outlet 58 at one end of the array of the peripheral outlets 58 for the main gas and the center of the EUV light focusing mirror 23, and a line segment linking the outer edge of the peripheral outlet 58 at the other end and the center of the EUV light focusing mirror 23, an arrangement angle of the peripheral members provided between them. The peripheral members may include the position sensor 7, the position sensor light source 8, the energy measurement sensor 9, and the like. The arrangement angle of the peripheral member may be an angle defined by a pair of line segments linking both sides of the peripheral member and the center of the EUV light focusing mirror 23.

In the case of FIG. 21, for example, the effective blowout angle θ of the peripheral outlets 58 from which the peripheral main gas flow F3m is blown out may be represented by the expression provided below. Here, between the target supply unit 26 and the position sensor light source 8, an angle θ defined by a line segment linking the outer edge of the peripheral outlet 58 at one end of the array of the peripheral outlets 58 and the center of the EUV light focusing mirror 23, and a line segment linking the outer edge of the peripheral outlet 58 at the other end and the center of the EUV light focusing mirror 23, may be represented by θ1. Further, an angle of the peripheral outlets 58 for the main gas on the right outer side of the position sensor light source 8 may be represented by θ2. Further, in FIG. 21, only one peripheral outlet 58 is provided on the right outer side of the position sensor light source 8. Accordingly, in this case, the outer edge of the peripheral outlet 58 may serve as the basis of the angle θ2.

$$20° \leq \theta(=\theta1+\theta2) \leq 45°$$

[6.2 Operation]

The peripheral head 57 may blow out the peripheral main gas flow F3m having a blowout width of the effective blowout angle θ from the plurality of peripheral outlets 58 that are provided while avoiding the peripheral members disposed near the outer peripheral portion 47 of the EUV light focusing mirror 23.

[6.3 Effect]

In the present embodiment, since the effective blowout angle θ is secured as the blowout width of the peripheral main gas flow F3m, even in the case where it is necessary to arrange the peripheral members near the outer peripheral portion 47 of the EUV light focusing mirror 23, a gas flow that is the same as that of FIG. 6 can be generated.

Consequently, in the present embodiment, even though the peripheral members are disposed near the outer peripheral portion 47 of the EUV light focusing mirror 23, the clean area of the EUV light focusing mirror 23 can be less likely to be affected.

7. Fourth Embodiment

In the present embodiment, description will be given on an example in which the conical hood 41 protrudes from the reflection surface 46 having a concave curved shape of the EUV light focusing mirror 23.

The part common to that of the description provided above is denoted by a common reference sign, and the description thereof is omitted.

[7.1 Configuration]

Figure 22:
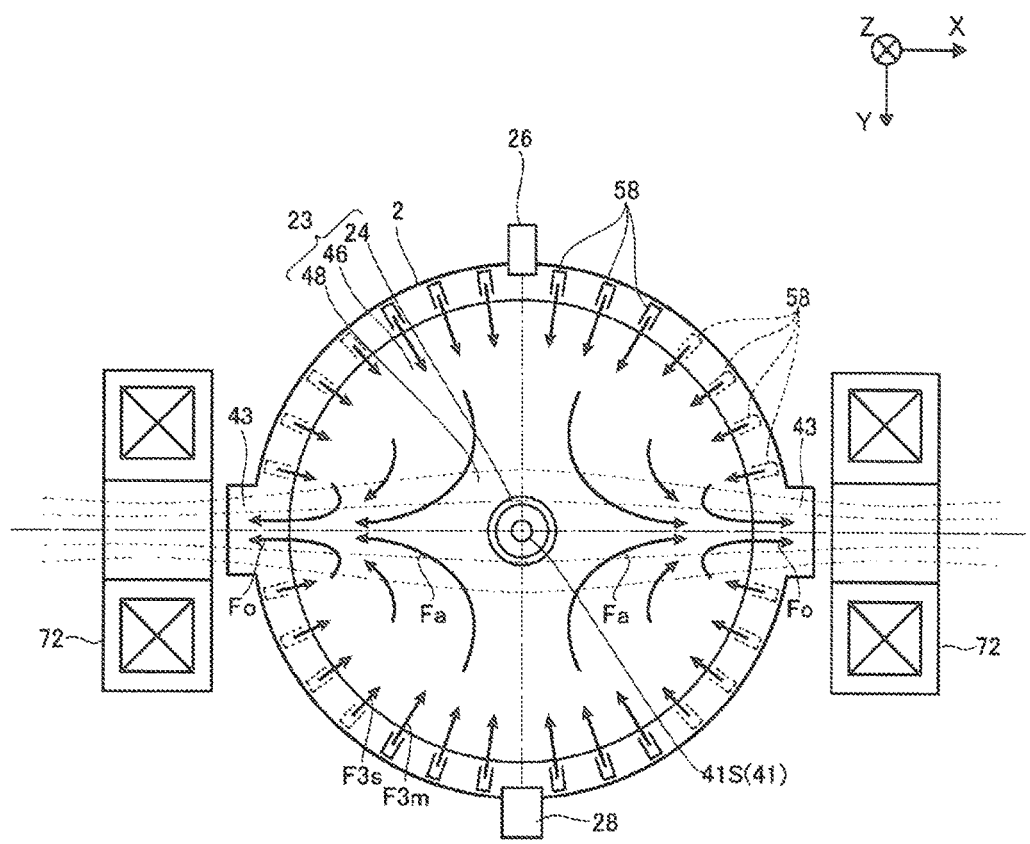
FIG. 22 schematically illustrates a cross-section perpendicular to a Z axis, of a chamber of a fourth embodiment.
Figure 23:
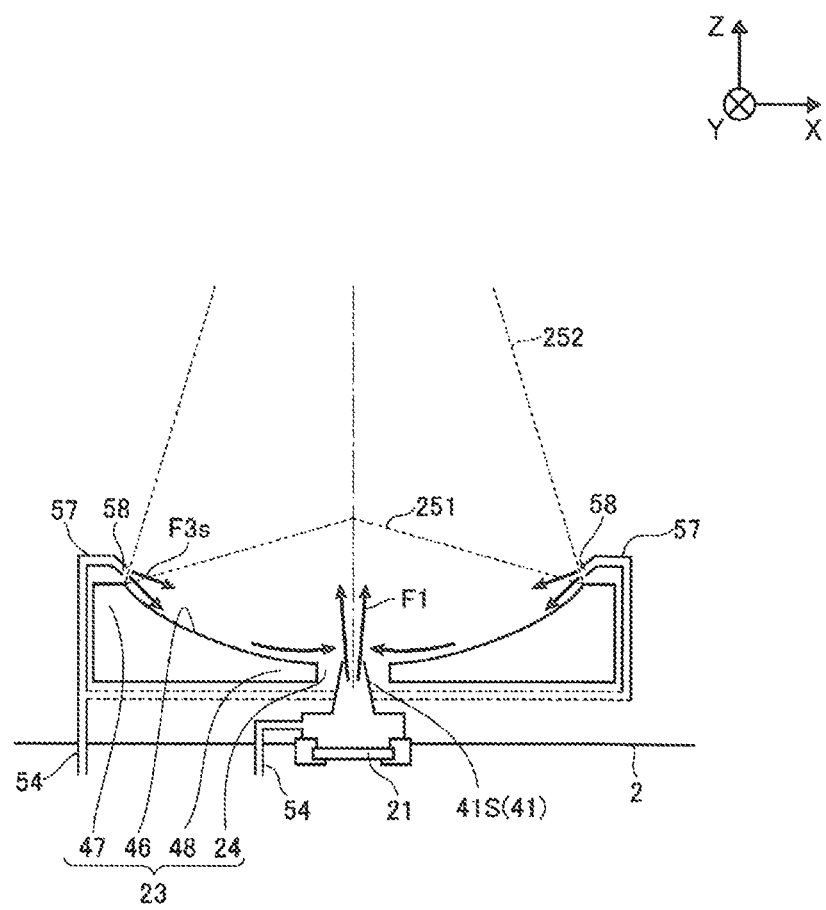
FIG. 23 schematically illustrates a cross-section perpendicular to a Y axis, of the chamber of FIG. 22.

FIGS. 22 and 23 are schematic illustrations of a chamber 2 of the present embodiment. FIG. 22 may be a cross-sectional view from the same viewpoint as that of FIG. 6, and FIG. 23 may be a cross-sectional view from the same viewpoint as that of FIG. 7.

The conical hood 41 may be formed to be short such that the tip portion thereof does not protrude from the reflection surface 46 having a concave curved shape of the EUV light focusing mirror 23. Hereinafter, to distinguish the present embodiment from the first embodiment, the conical hood 41 of the present embodiment is referred to as a short conical hood 41S, and the conical hood 41 of the first embodiment is referred to as a long conical hood 41L.

The gas flow rate in the short conical hood 41S may be 2 slm or higher but 20 slm or lower (2, 4, 6, 8, 10, 12, 14, 16, 18, 20 slm). More preferably, it may be 4 slm or higher but 8 slm or lower (4, 6, 8 slm). The flow rate in the present embodiment may be the same as that in the first embodiment.

[7.2 Operation]

The gas supplying device 51 may supply the gas from the branch unit 53 into the short conical hood 41S.

Figure 24:
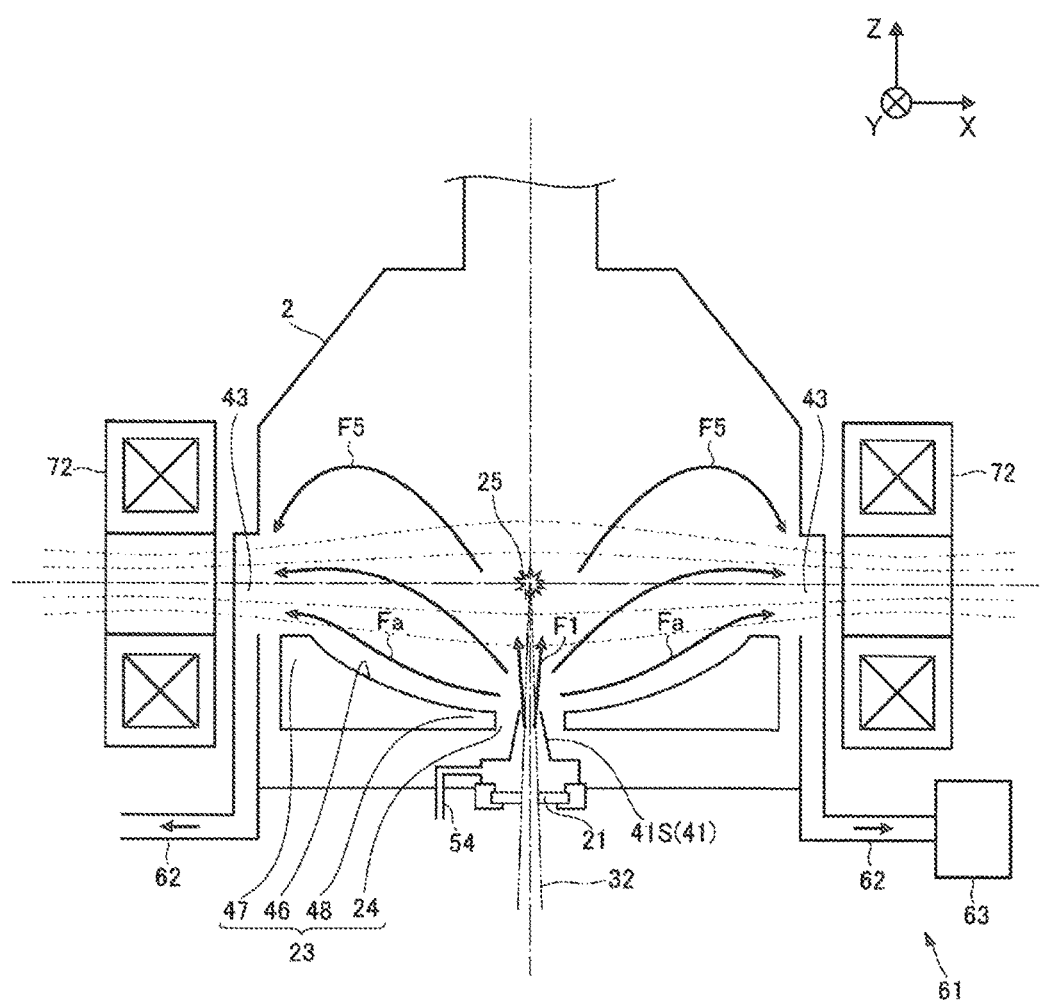
FIG. 24 schematically illustrates a gas flow in a direction perpendicular to the Y axis in the chamber of FIGS. 22 and 23.
Figure 25:
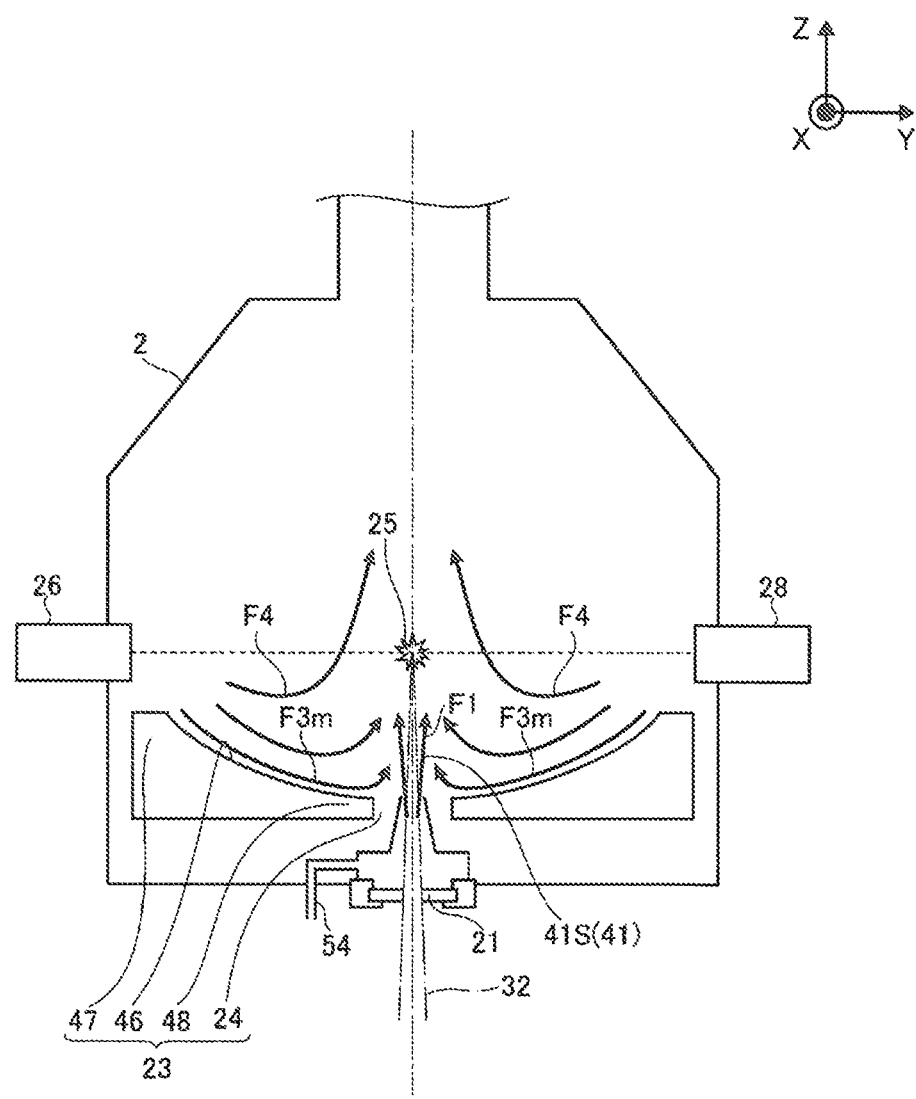
FIG. 25 schematically illustrates a gas flow in a direction perpendicular to the X axis in the chamber of FIGS. 22 and 23.

FIGS. 24 and 25 illustrate a gas flow in the chamber 2. FIG. 24 may be a cross-sectional view from the same viewpoint as that of FIG. 8, and FIG. 25 may be a cross-sectional view from the same viewpoint as that of FIG. 9.

As illustrated in FIGS. 24 and 25, the gas flow in the chamber 2 may be basically the same as that of FIGS. 9 and 10 of the first embodiment.

However, in the first embodiment, the peripheral gas flow F3 flowing from the peripheral head 57 toward the center portion of the EUV light focusing mirror 23 collides with the side face of the long conical hood 41L, and after the collision, flows to the surroundings. Accordingly, the stannane gas ($SnH_4$) may be thermally decomposed easily on the side face of the conical hood 41 although the amount thereof is not as large as that of the comparative example. When the stannane gas is thermally decomposed, a tin atom may be separated and may easily adhere again to the center portion of the reflection surface 46 of the EUV light focusing mirror 23.

Meanwhile, in the present embodiment, the short conical hood 41S is used and the tip portion thereof does not protrude from the reflection surface 46 having a concave curved shape. Therefore, the peripheral gas flow F3 may be less likely to collide with the side face of the short conical hood 41S. The gas that is blown out of the peripheral head 57 and flows toward the center portion 48 of the EUV light focusing mirror 23 may be less likely to collide with the side face of the short conical hood 41S.

Further, in the first embodiment, the side face of the conical hood 41 is positioned at the center portion 48 of the EUV light focusing mirror 23. Accordingly, the velocity of the peripheral gas flow F3 of the peripheral head 57 may be lowered.

On the other hand, in the present embodiment, the conical hood 41 is not present. Accordingly, the peripheral gas flow F3 of the peripheral head 57 is drawn by the cone gas flow F1 blown out of the tip of the short conical hood 41 toward the plasma generation region 25, and may join it without reducing the velocity.

Consequently, in the present embodiment, the velocity of the gas flow in the center portion 48 of the EUV light focusing mirror 23 may be increased, compared with the first embodiment.

[7.3 Effect]

In the present embodiment, the tip portion of the conical hood 41 does not protrude from the reflection surface 46 having a concave curved shape. Therefore, the stannane gas colliding with the conical hood 41 is less likely to be thermally decomposed, whereby a tin atom can be less likely to adhere again to the center portion 48 of the EUV light focusing mirror 23.

Further, in the present embodiment, the gas flow may become faster in the center portion 48 of the EUV light focusing mirror 23. Thereby, it can be expected that an effect of discharging particles such as a tin atom and stannous ion is enhanced.

8. Fifth Embodiment

In the present embodiment, an example of generating, by a center head 55, a basic flow of the gas flow Fa from the center portion 48 of the reflection surface 46 of the EUV light focusing mirror 23 toward the pair of discharge ports 43 will be described.

The part common to that of the description provided above is denoted by a common reference sign, and the description thereof is omitted.

[8.1 Configuration]

Figure 26:
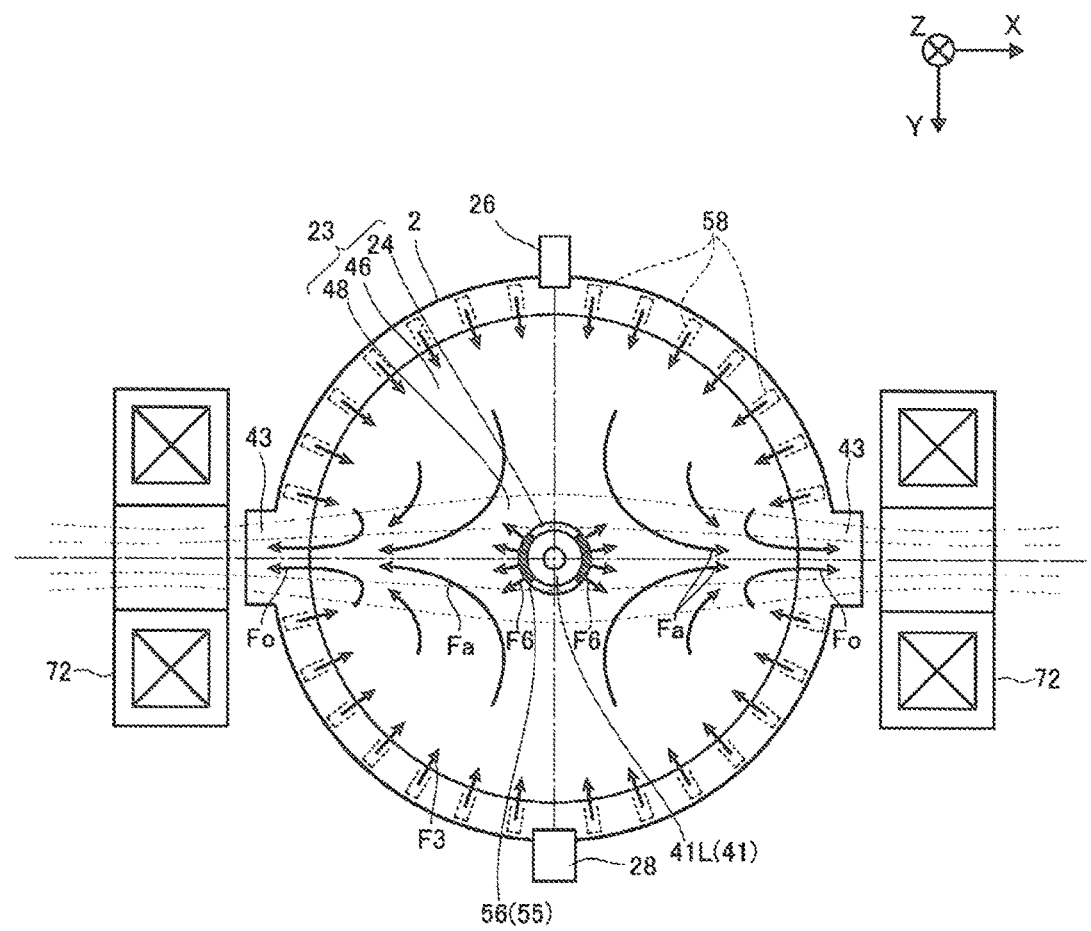
FIG. 26 schematically illustrates a cross-section perpendicular to a Z axis, of a chamber of a fifth embodiment.
Figure 27:
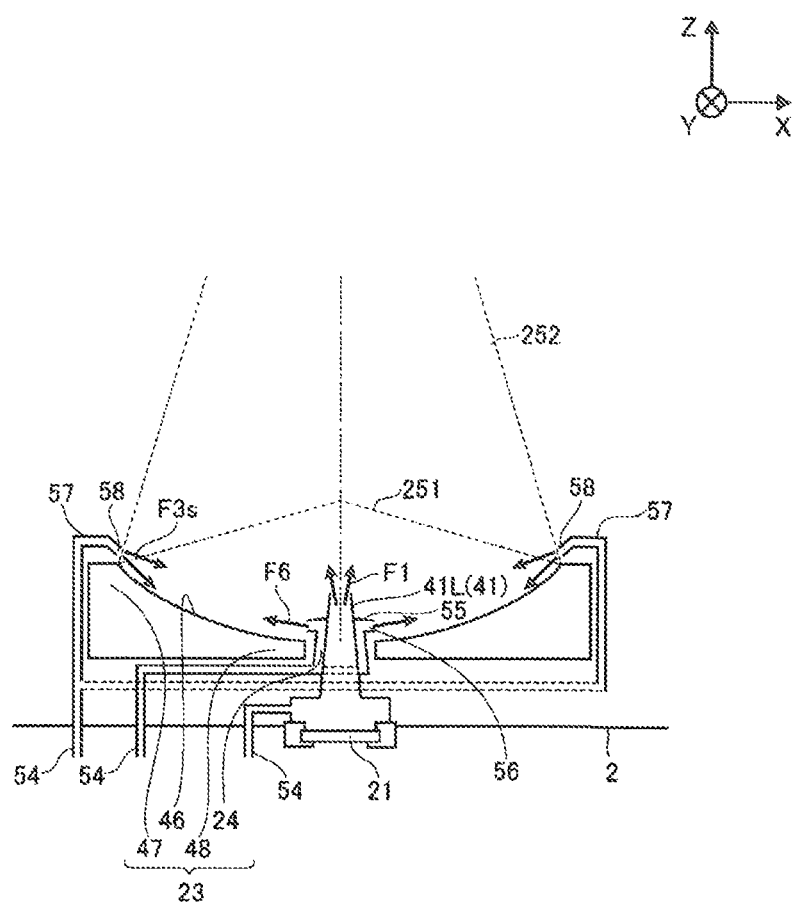
FIG. 27 schematically illustrates a cross-section perpendicular to a Y axis, of the chamber of FIG. 26.

FIGS. 26 and 27 are schematic illustrations of a chamber 2 of the present embodiment. FIG. 26 may be a cross-sectional view from the same viewpoint as that of FIG. 6, and FIG. 27 may be a cross-sectional view from the same viewpoint as that of FIG. 7.

The gas supplying device 51 may include the gas tank 52, the branch unit 53, and the branch ducts 54 similar to the configuration of FIG. 2, and also include the peripheral head 57 and the center head 55.

The center head 55 may be provided around the conical hood 41, along the outer periphery of the conical hood 41 having an almost truncated conical shape. The center head 55 may be positioned in the reflection surface 46 having a concave curved shape of the EUV light focusing mirror 23. The center head 55 may have a slit-like center outlet 56 or a plurality of circular center outlets 56, in a portion opposite to the pair of discharge ports 43 on the side face of the conical hood 41. The center head 55 may blow out a center gas flow F6 in a particular direction flowing from the center portion 48 of the reflection surface 46 toward the pair of discharge ports 43 along the concave curved shape of the reflection surface 46. The center head 55 may blow out the center gas flow F6 in a particular direction in an angle range of ±tens degrees, on a basis of the direction toward each of the pair of discharge ports 43.

The branch unit 53 may be connected with the conical hood 41, the center head 55, and the peripheral head 57 by the branch ducts 54, and may branch the gas to the center head 55 and the peripheral head 57.

[8.2 Operation]

The branch unit 53 may branch and supply the gas to the conical hood 41, the center head 55 and the peripheral head 57.

The center head 55 may blow out, from the center outlet 56, the center gas flow F6 in a particular direction flowing from the center portion 48 toward the pair of discharge ports 43 along the concave curved shape of the reflection surface 46. The flow rate of the gas to the center head 55 may be 2 slm or higher, for example.

The peripheral head 57 may blow out the peripheral gas flow F3 from the outer peripheral portion 47 to the center portion 48 along the concave curved shape of the reflection surface 46. The peripheral head 57 may blow out the peripheral gas flow F3 having almost the same velocity and equalized pressure, from each of the peripheral outlets 58. The peripheral head 57 may blow out the peripheral main gas flow F3$m$ and the peripheral sub gas flow F3$s$ of different velocities, as in the case of the first embodiment.

Figure 28:
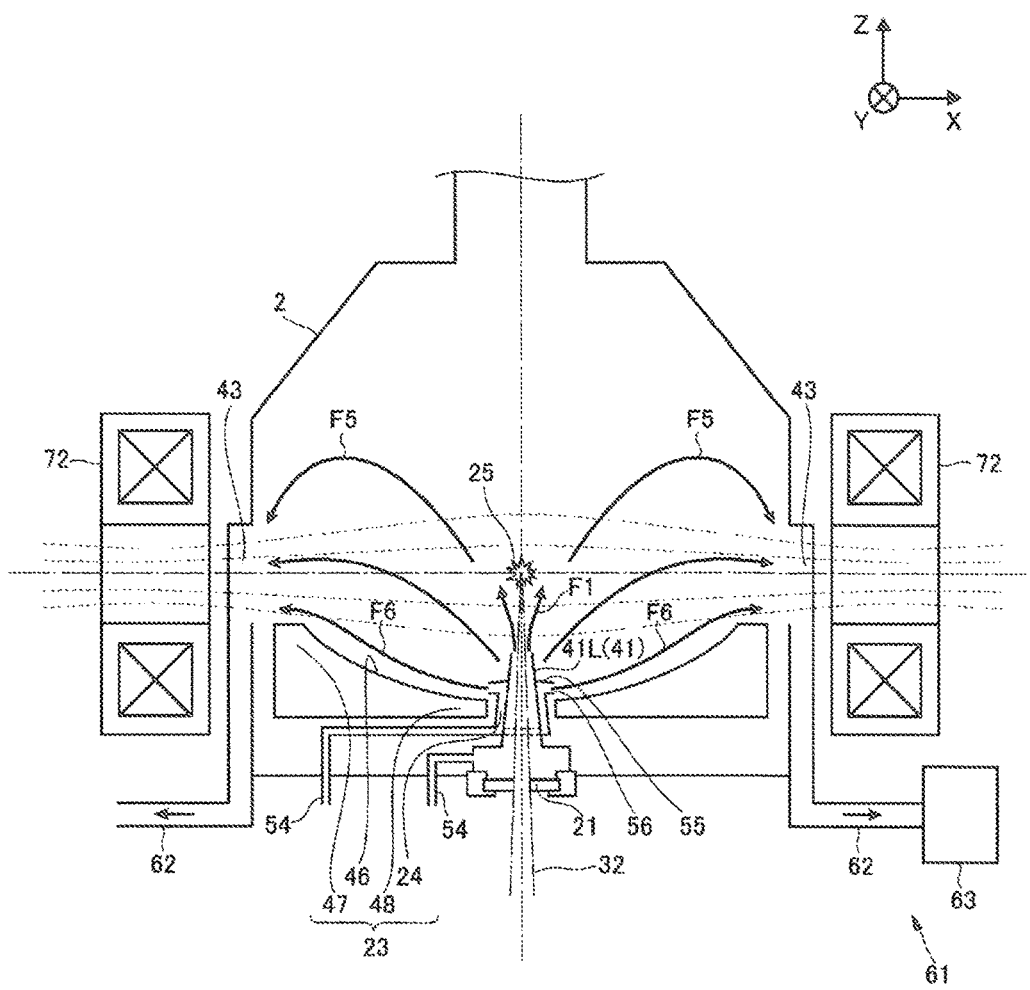
FIG. 28 schematically illustrates a gas flow in a direction perpendicular to the Y axis in the chamber of FIGS. 26 and 27.
Figure 29:
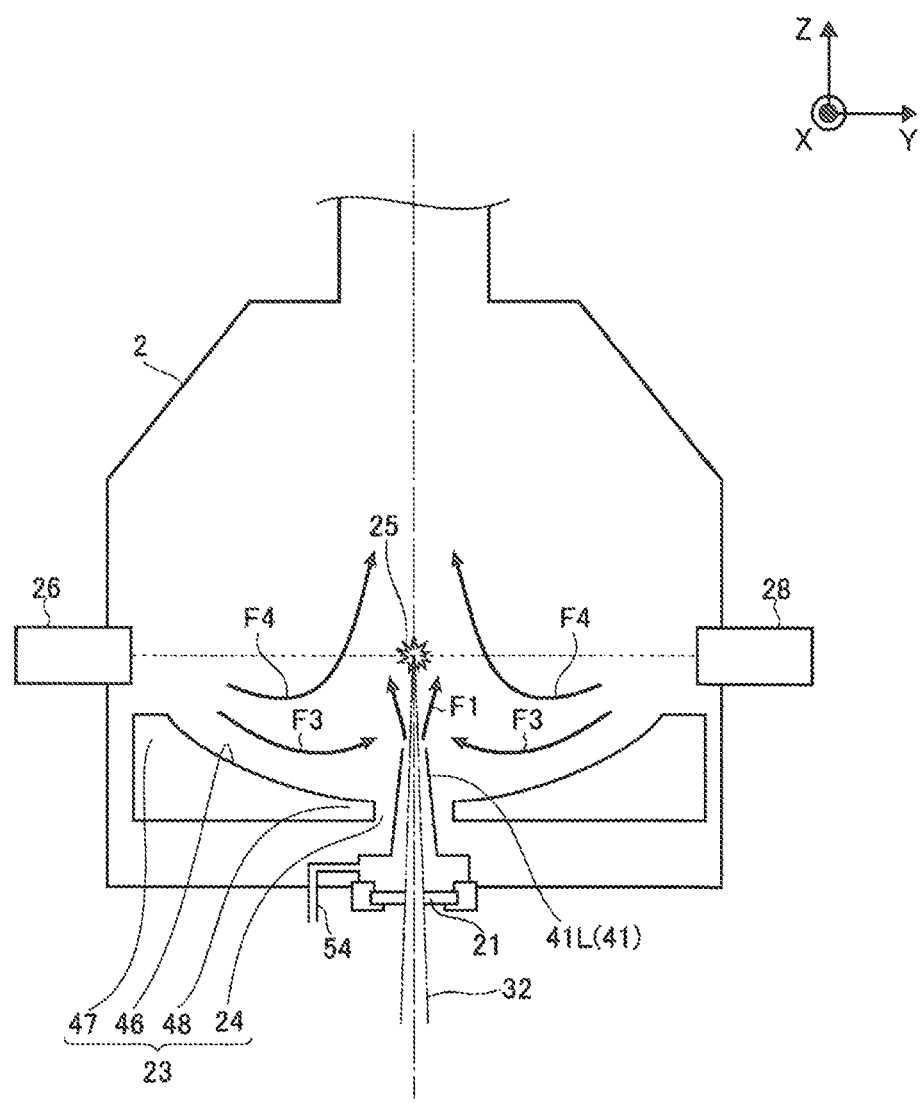
FIG. 29 schematically illustrates a gas flow in a direction perpendicular to the X axis in the chamber of FIGS. 26 and 27.

FIGS. 28 and 29 illustrate a gas flow in the chamber 2. FIG. 28 may be a cross-sectional view from the same viewpoint as that of FIG. 8, and FIG. 29 may be a cross-sectional view from the same viewpoint as that of FIG. 9.

The center gas flow F6 in a particular direction blown out of the center head 55 may flow from the center portion 48 of the reflection surface 46 toward the outer peripheral portion 47 along the concave curved shape of the reflection surface 46, as illustrated in FIG. 28. Even in a space separated from the reflection surface 46, in the X axis direction of FIG. 28, the first separated gas flow F4 in a direction along the center gas flow F6 in a particular direction blown out of the center head 55 may be generated.

The peripheral gas flow F3 blown out of the peripheral head 57 may flow from the outer peripheral portion 47 toward the center portion 48 along the reflection surface 46, as illustrated in FIG. 29. Then, as illustrated in FIG. 26, the peripheral gas flow F3 blown out of the peripheral head 57 may join the center gas flow F6 in a particular direction blown out of the center head 55. Even in a space separated from the reflection surface 46, in the Y axis direction of FIG. 29, a flow in a direction along the center gas flow F6 in a particular direction blown out of the center head 55 may be generated.

Consequently, in the present invention, the convection flow Fc of the gas may be less likely to be generated around the conical hood 41, as in the case of the first embodiment.

[8.3 Effect]

In the present embodiment, the center gas flow F6 in a particular direction, flowing from the center portion 48 of the reflection surface 46 toward the pair of discharge ports 43 along the concave curved shape of the reflection surface 46, may be blown out of the center head 55. Then, the peripheral gas flow F3 blown out of the peripheral head 57 toward the center portion 48 may join the center gas flow F6 in a particular direction from the center head 55.

Accordingly, in the present embodiment, the discharge gas flow Fo toward the pair of discharge ports 43 may be increased by the peripheral gas flow F3 blown out of the peripheral head 57.

Consequently, in the present embodiment, tin particles may be less likely to adhere not only to the center portion 48 of the reflection surface 46 but also to a portion around the discharge ports 43. In the present embodiment, part of low-speed ions and neutral particles in which ions are neutralized can be less likely to adhere to a portion near the pair of discharge ports 43 of the reflection surface 46 of the EUV light focusing mirror 23, even on a long-term basis.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. An extreme ultraviolet light generating device comprising:

a chamber;

an EUV light focusing mirror provided in the chamber, the EUV light focusing mirror including a reflection surface having a concave curved shape and an outer peripheral portion around an outer edge of the reflection surface, the EUV light focusing mirror being configured to focus EUV light radiated from plasma that is generated when a target is irradiated with laser light;

a gas supplying device including a peripheral head provided on the outer peripheral portion or along the outer peripheral portion, the gas supplying device being configured to blow out a gas flow; and a discharge device including a discharge path forming a discharge port near the outer peripheral portion, the discharge device being configured to discharge an ion or a particle, generated together with the plasma, from the discharge port along with the gas flow, the peripheral head including a plurality of peripheral outlets from each of which a peripheral gas flow is blown out, the peripheral gas flow flowing from the outer peripheral portion or a vicinity of the outer peripheral portion along the reflection surface, and the peripheral head allowing a plurality of blown-out peripheral gas flows to join on the reflection surface having the concave curved shape to thereby form a gas flow flowing along the reflection surface toward the discharge port.

2. The extreme ultraviolet light generating device according to claim 1, wherein the discharge device includes a pair of the discharge ports, the discharge ports being arranged on both sides of the EUV light focusing mirror so as to interpose the EUV light focusing mirror between the discharge ports, the peripheral head includes a pair of the peripheral outlets from which peripheral gas flows are blown out, the peripheral gas flows facing each other in a direction perpendicular to an arrangement direction of the discharge ports, and the peripheral gas flows, blown out to face each other, join in a center portion of the reflection surface having the concave curved shape to thereby form a pair of composite gas flows flowing from the center portion toward both of the pair of the discharge ports along the reflection surface.

3. The extreme ultraviolet light generating device according to claim 2, further comprising a conical hood provided to protrude into the chamber so as to cover a window that guides laser light into the chamber, wherein the EUV light focusing mirror has a through hole in the center portion, the conical hood is provided toward the through hole, and a tip portion of the conical hood protrudes from the reflection surface having the concave curved shape, and the gas supplying device supplies a gas into the conical hood and allows the conical hood to blow out a cone gas flow from the tip portion of the conical hood.

4. The extreme ultraviolet light generating device according to claim 2, further comprising
a conical hood provided to protrude into the chamber so as to cover a window that guides laser light into the chamber, wherein
the EUV light focusing mirror has a through hole in the center portion,
the conical hood is provided inside the through hole, and a tip portion of the conical hood does not protrude from the reflection surface having the concave curved shape, and
the gas supplying device supplies a gas into the conical hood and allows the conical hood to blow out a cone gas flow from the tip portion of the conical hood.

5. The extreme ultraviolet light generating device according to claim 2, wherein
at least one of peripheral members is further provided on the outer peripheral portion or in a vicinity of the outer peripheral portion of the EUV light focusing mirror, the peripheral members including the discharge path, a target supply unit configured to supply the target, a target recovery unit configured to recover the target, a sensor configured to detect the target, and a sensor configured to detect the laser light,
the peripheral head is provided throughout an entire circumference of the reflection surface except for a portion in which the peripheral member is provided, and
the peripheral head blows out the peripheral gas flows, velocities of which are different from each other, from the plurality of the peripheral outlets to thereby form a pair of the composite gas flows flowing from the center portion of the reflection surface toward the pair of the discharge ports.

6. The extreme ultraviolet light generating device according to claim 5, wherein
the peripheral head is configured such that a velocity of the peripheral gas flow blown out of the peripheral outlet arranged in a vicinity of a section in the direction perpendicular to the arrangement direction of the pair of the discharge ports is higher than a velocity of the peripheral gas flow blown out of the peripheral outlet in a vicinity of the pair of the discharge ports.

7. The extreme ultraviolet light generating device according to claim 6, wherein
the peripheral head is configured such that a velocity of the peripheral gas flow blown out of the peripheral outlet arranged in the vicinity of a section in the direction perpendicular to the arrangement direction of the pair of the discharge ports in an angular range of at least 20° or larger but 45° or smaller except for a portion in which the peripheral member is provided is higher than a velocity of the peripheral gas flow blown out of the peripheral outlet in a remaining range.

8. The extreme ultraviolet light generating device according to claim 7, wherein
the gas supplying device includes a branch chamber connected with the peripheral head, and
the branch chamber is configured to branch a gas flow to the plurality of the peripheral outlets of the peripheral head.

9. The extreme ultraviolet light generating device according to claim 2, further comprising
a magnetic field generator, wherein
the magnetic field generator includes a pair of electromagnetic coils disposed in a direction that is the same as the arrangement direction of the pair of the discharge ports with respect to the EUV light focusing mirror, and
the magnetic field generator allows an electric current to flow through the pair of the electromagnetic coils to generate a line of magnetic force along the arrangement direction of the pair of the discharge ports.

10. An extreme ultraviolet light generating device, comprising:
a chamber;
an EUV light focusing mirror provided in the chamber, the EUV light focusing mirror including a reflection surface having a concave curved shape and an outer peripheral portion around an outer edge of the reflection surface, the EUV light focusing mirror being configured to focus EUV light radiated from plasma that is generated when a target is irradiated with laser light;
a gas supplying device including a center head and a peripheral head, the center head being provided in a center portion of the reflection surface and configured to blow out a gas flow, the peripheral head being provided on the outer peripheral portion or along the outer peripheral portion and configured to blow out a gas flow; and
a discharge device including a discharge path forming a discharge port near the outer peripheral portion, the discharge device being configured to discharge an ion or a particle, generated together with the plasma, from the discharge port along with the gas flow,
the center head being configured to blow out a center gas flow in a particular direction from the center portion toward the discharge port along the reflection surface having the concave curved shape such that a peripheral gas flow blown out by the peripheral head from the outer peripheral portion along the reflection surface joins the center gas flow in the particular direction.

* * * * *